US007906985B2

(12) United States Patent
Kim et al.

(10) Patent No.: US 7,906,985 B2
(45) Date of Patent: Mar. 15, 2011

(54) SEMICONDUCTOR DEVICE

(75) Inventors: Kyung-Hoon Kim, Gyeonggi-do (KR); Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/494,433

(22) Filed: Jun. 30, 2009

(65) Prior Publication Data

US 2010/0308860 A1 Dec. 9, 2010

(30) Foreign Application Priority Data

Jun. 4, 2009 (KR) ........................ 10-2009-0049392

(51) Int. Cl.
*H03K 19/003* (2006.01)
*H03K 17/16* (2006.01)

(52) U.S. Cl. ........................................... 326/27; 326/87

(58) Field of Classification Search .................... 326/27, 326/30, 82, 83, 86, 87
See application file for complete search history.

(56) References Cited

U.S. PATENT DOCUMENTS 7,707,469 B2 * 4/2010 Lee et al. ...................... 714/721
2007/0124518 A1 * 5/2007 Fujiwara ......................... 710/71

FOREIGN PATENT DOCUMENTS

KR 1020050047294 5/2005

OTHER PUBLICATIONS

Notice of Preliminary Rejection issued from Korean Intellectual Property Office on Nov. 30, 2010.

* cited by examiner

*Primary Examiner* — Daniel D Chang
(74) *Attorney, Agent, or Firm* — IP & T Group LLP

(57) ABSTRACT

A semiconductor device includes a plurality of data driving units, each configured to drive a corresponding data output pad by a power supply voltage supplied through a power supply voltage input pin and a ground voltage supplied through a ground voltage input pin, in response to a corresponding bit of a data code, a pattern sensing unit configured to sense a bit pattern of the data code and generate a pattern sensing signal, and a phantom driving unit configured to form a current path between the power supply voltage input pin and the ground voltage input pin and to drive the current path by a driving force determined in response to the pattern sensing signal.

40 Claims, 9 Drawing Sheets

PACKAGE
40A
400A
420A
DRV_ CTL0
PRE-DRIVE UNIT
DATA<0>
RUI_SOURCE_0
PDI_SINK_0
440A
VDDQ
VD DQP
DQ 0
DQ 0P
VSSQ
VS SQP
BOARD Center Tap Termination
40B
400B
420B
DRV_ CTL1
DATA<1>
RUI_SOURCE_1
PDI_SINK_1
440B
DQ 1
DQ 1P
40C
400C
420C
DRV_ CTL2
DATA<2>
RUI_SOURCE_2
PDI_SINK_2
440C
DQ 2
DQ 2P
40D
400D
420D
DRV_ CTL3
DATA<3>
RUI_SOURCE_3
PDI_SINK_3
440D
DQ 3
DQ 3P
460
PATTERN SENSING UNIT
DATA<0:3>
PHANTOM_ SENS <0:1>
480
PU PTD
PTI_SOURCE
REF PTD1
490
REF PTD2
PTI_SINK
PD PTD
COUNT_ NUM <2:3>

SEMICONDUCTOR DEVICE

CROSS-REFERENCE(S) TO RELATED APPLICATIONS

The present application claims priority of Korean Patent Application No(s). 10-2009-0049392, filed on Jun. 4, 2009, the disclosure of which is incorporated herein by reference in its entirety.

BACKGROUND OF THE INVENTION

The present invention relates to semiconductor design technologies, and in particular, to a data output circuit of a semiconductor device. More particularly, the present invention relates to a data output circuit of a semiconductor device, which is capable of stably outputting data while suppressing a simultaneous switching output (SSO) noise.

FIG. 1 is a circuit diagram of a conventional data output circuit of a semiconductor device.

Referring to FIG. 1, a conventional data output circuit of a semiconductor device includes a plurality of pre-drive units 100A, 100B, 100C and 100D, a plurality of pull-up main driving units 120A, 120B, 120C and 120D, and a plurality of pull-down main driving units 140A, 140B, 140C and 140D. The pre-drive units 100A, 100B, 100C and 100D generate a plurality of drive control signals DRV_CTL0, DRV_CTL1, DRV_CTL2 and DRV_CTL3 in response to a plurality of bits DATA<0>, DATA<1>, DATA<2> and DATA<3> of a data code DATA<0:3>, respectively. The pull-up main driving units 120A, 120B, 120C and 120D control the connections between a power supply voltage terminal VDDQ and a plurality of data output pads DQ0, DQ1, DQ2 and DQ3 in response to the drive control signals DRV_CTL0, DRV_CTL1, DRV_CTL2 and DRV_CTL3, respectively. Herein, the data output pads DQ0, DQ1, DQ2 and DQ3 are terminated to the power supply voltage terminal VDDQ through a plurality of data output pins DQ0P, DQ1P, DQ2P and DQ3P, respectively. The pull-down main driving units 140A, 140B, 140C and 140D pull-down drive the data output pads DQ1, DQ1, DQ2 and DQ3 by pull-down sink currents PDI_SINK_0, PDI_SINK_1, PDI_SINK_2 and PDI_SINK_3 of predetermined intensities sinking through a ground voltage terminal VSSQ in response to the drive control signals DRV_CTL0, DRV_CTL1, DRV_CTL2 and DRV_CTL3, respectively. Herein, the data output pads DQ0, DQ1, DQ2 and DQ3 are terminated to the power supply voltage terminal VDDQ through the data output pins DQ0P, DQ1P, DQ2P and DQ3P, respectively.

Based on the above configuration, an operation of the conventional data output circuit is described hereinafter.

As illustrated in FIG. 1, because the data output pads DQ0, DQ1, DQ2, and DQ3 are terminated to the power supply voltage terminal VDDQ through a power supply voltage input pin VDDQP, the conventional data output circuit maintains a power supply voltage (VDD) level while data are not outputted.

When the inputted data code DATA<0>/DATA<1>/DATA<2>/DATA<3> has a value of '0', the pre-drive unit 100A/100B/100C/100D outputs the drive control signal DRV_CTL0/DRV_CTL1/DRV_CTL2/DRV_CTL3 with the power supply voltage (VDD) level.

When the drive control signal DRV_CTL0/DRV_CTL1/DRV_CTL2/DRV_CTL3 has the power supply voltage (VDD) level, the pull-up main driving unit 120A/120B/120C/120D forms an open circuit between the power supply voltage terminal VDDQ and the data output pad DQ0/DQ1/DQ2/DQ3, so that the power supply voltage terminal VDDQ and the data output pad DQ0/DQ1/DQ2/DQ3 have different voltage levels. Also, the pull-down main driving unit 140A/140B/140C/140D forms a short circuit between the ground voltage terminal VSSQ and the data output pad DQ0/DQ1/DQ2/DQ3, so that the pull-down sink current PDI_SINK_0/PDI_SINK_1/PDI_SINK_2/PDI_SINK_3 flows to the ground voltage terminal VSSQ from the data output pad DQ0/DQ1/DQ2/DQ3.

That is, when the data code DATA<0>/DATA<1>/DATA<2>/DATA<3> has a value of '0' and thus the drive control signal DRV_CTL0/DRV_CTL1/DRV_CTL2/DRV_CTL3 has the power supply voltage (VDD) level, the power supply voltage terminal VDDQ is disconnected from the data output pad DQ0/DQ1/DQ2/DQ3 and the pull-down sink current PDI_SINK 0/PDI_SINK 1/PDI_SINK_2/PDI_SINK_3 flows to the ground voltage terminal VSSQ from the data output pad DQ0/DQ1/DQ2/DQ3. Therefore, the voltage level of the data output pad DQ0/DQ1/DQ2/DQ3 becomes lower than that of the power supply voltage terminal VDDQ, thus causing a logic low level.

For reference, because the power supply voltage terminal VDDQ is disconnected from the data output pad DQ0/DQ1/DQ2/DQ3, even when the data output pad DQ0/DQ1/DQ2/DQ3 is terminated to the power supply voltage terminal VDDQ, the pull-down sink current PDI_SINK_0/PDI_SINK_1/PDI_SINK_2/PDI_SINK_3 flows from the data output pad DQ0/DQ1/DQ2/DQ3 to the ground voltage terminal VSSQ and thus the voltage level of the data output pad DQ0/DQ1/DQ2/DQ3 becomes lower than that of the power supply voltage terminal VDDQ.

When the inputted data code DATA<0>/DATA<1>/DATA<2>/DATA<3> has a value of '1', the pre-drive unit 100A/100B/100C/100D outputs the drive control signal DRV_CTL0/DRV_CTL1/DRV_CTL2/DRV_CTL3 with the ground voltage (VSS) level.

When the drive control signal DRV_CTL0/DRV_CTL1/DRV_CTL2/DRV_CTL3 has the ground voltage (VSS) level, the pull-up main driving unit 120A/120B/120C/120D forms a short circuit between the power supply voltage terminal VDDQ and the data output pad DQ0/DQ1/DQ2/DQ3, so that the power supply voltage terminal VDDQ and the data output pad DQ0/DQ1/DQ2/DQ3 have the same power supply voltage (VDD) level. Also, the pull-down main driving unit 140A/140B/140C/140D forms an open circuit between the ground voltage terminal VSSQ and the data output pad DQ0/DQ1/DQ2/DQ3, so that the pull-down sink current PDI_SINK_0/PDI_SINK_1/PDI_SINK_2/PDI_SINK_3 does not flow to the ground voltage terminal VSSQ from the data output pad DQ0/DQ1/DQ2/DQ3.

That is, when the data code DATA<0>/DATA<1>/DATA<2>/DATA<3> has a value of '1' and thus the drive control signal DRV_CTL0/DRV_CTL1/DRV_CTL2/DRV_CTL3 has the ground voltage (VSS) level, the data output pad DQ0/DQ1/DQ2/DQ3 and the power supply voltage terminal VDDQ having the same power supply voltage (VDD) level are connected to each other and the ground voltage terminal VSSQ is disconnected from the data output pad DQ0/DQ1/DQ2/DQ3, so that the pull-down sink current PDI_SINK_0/PDI_SINK_1/PDI_SINK_2/PDI_SINK_3 does not flow to the ground voltage terminal VSSQ from the data output pad DQ0/DQ1/DQ2/DQ3. Therefore, the voltage level of the data output pad DQ0/DQ1/DQ2/DQ3 becomes equal to that of the power supply voltage terminal VDDQ, thus causing a logic high level.

For reference, no current flows from the power supply voltage terminal VDDQ to the data output pad DQ0/DQ1/

DQ2/DQ3, because the ground voltage terminal VSSQ is disconnected from the data output pad DQ0/DQ1/DQ2/DQ3 and simultaneously the data output pad DQ0/DQ1/DQ2/DQ3 automatically becomes the power supply voltage (VDD) level through the termination-connected power supply voltage terminal VDDQ, that is, because no current flows from the power supply voltage terminal VDDQ with the same power supply voltage VDD to the data output pad DQ0/DQ1/DQ2/DQ3.

As described above, the conventional data output circuit drives the data output pad DQ0/DQ1/DQ2/DQ3 at the power supply voltage (VDD) level or at the ground voltage (VSS) level according to the value of the data code DATA<0>/DATA<1>/DATA<2>/DATA<3>. As illustrated in FIG. 1, because the data output pad DQ0/DQ1/DQ2/DQ3 is terminated to the power supply voltage (VDD) level (which is generally called a pseudo open drain termination state), the conventional data output circuit does not include an operation of directly driving the data output pad DQ0/DQ1/DQ2/DQ3 at the power supply voltage (VDD) level, which may vary depending on the voltage level terminating the data output pad DQ0/DQ1/DQ2/DQ3.

For example, when the data output pad DQ0/DQ1/DQ2/DQ3 is terminated to the ground voltage (VSS) level (which is generally called a pseudo open source termination state), the conventional data output circuit includes an operation of driving the data output pad DQ0/DQ1/DQ2/DQ3 at the power supply voltage (VDD) level but does not include an operation of driving the data output pad DQ0/DQ1/DQ2/DQ3 at the ground voltage (VSS) level. When the data output pad DQ0/DQ1/DQ2/DQ3 is terminated to the intermediate voltage level between the power supply voltage (VDD) level and the ground voltage (VSS) level (which is generally called a center tap termination state), the conventional data output circuit includes an operation of driving the data output pad DQ0/DQ1/DQ2/DQ3 at the power supply voltage (VDD) level and an operation of driving the data output pad DQ0/DQ1/DQ2/DQ3 at the ground voltage (VSS) level.

Meanwhile, a simultaneous switching output (SSO) noise may occur in a data output circuit of a semiconductor device because a plurality of pads and a plurality of pins in the data output circuit simultaneously switch from a power supply voltage (VDD) level to a ground voltage (VSS) level, or from the ground voltage (VSS) level to the power supply voltage (VDD) level.

That is, when a plurality of data are outputted through the pads and the pins, if most of the data may have the power supply voltage (VDD) level at a first time point and have the ground voltage (VSS) level at a second time point subsequent to the first time point, a large amount of source current may suddenly flow into a ground voltage terminal VSSQ, so that some of the data may fail to switch from the power supply voltage (VDD) level to the ground voltage (VSS) level or switch later than a predetermined time point. This phenomenon is called a simultaneous switching output (SSO) noise.

Also, even when most of the data switch to the ground voltage (VSS) level at the second time point, if most of the data may have the power supply voltage (VDD) level at a third time point subsequent to the second time point, a large amount of sink current suddenly flows into a power supply voltage terminal VDDQ, so that some of the data may fail to switch from the ground voltage (VSS) level to the power supply voltage (VDD) level or switch later than a predetermined time point. This phenomenon is also called a simultaneous switching output (SSO) noise.

Such a simultaneous switching output (SSO) noise acts as a very important factor in the processing speed and the designing of a semiconductor device. Examples of the phenomenon caused by the simultaneous switching output (SSO) noise may include ground bounce and clock waveform degradation.

That is, the simultaneous switching output (SSO) noise may distort the data outputted from the data output circuit, thus failing to output normal data.

Like a data bus inversion scheme or an 8/10b coding scheme, a conventional scheme uses a noise preventing pad or pin as well as a plurality of pads or a plurality of pins for outputting a plurality of data, thereby preventing a simultaneous switching output (SSO) noise from occurring in the data outputted through the plurality of pads or the plurality of pins.

The data bus inversion scheme or the 8/10b coding scheme is well known in the art and thus its detailed description is not provided herein.

The data bus inversion scheme or the 8/10b coding scheme has a limitation in that it may additionally use a noise preventing pad or pin. This limitation becomes more severe as the number of data output pads or pins increases with an increase in the scale and complexity of a semiconductor device. This causes an excessive increase in the number of noise preventing pads or pins that must be provided in addition to data output pads or pins.

Such an excessive increase in the number of pads or pins in a semiconductor device may require a significantly increased area of the semiconductor device, which may cause a significantly increased fabrication cost of the semiconductor device.

SUMMARY OF THE INVENTION

An embodiment of the present invention is directed to provide a data output circuit of a semiconductor device, which can stably output data by preventing the occurrence of a simultaneous switching output (SSO) noise even when using a minimum number of additional pads for prevention of the occurrence of a simultaneous switching output (SSO) noise in addition to pads for data output of the semiconductor device.

Another embodiment of the present invention is directed to provide a data output circuit of a semiconductor device, which can stably output data by effectively suppressing a simultaneous switching output (SSO) noise even without using additional pins for reducing a simultaneous switching output (SSO) noise in addition to pins for data output of the semiconductor device.

In accordance with an aspect of the present invention, there is provided semiconductor device including a plurality of data driving units, a pattern sensing unit, and a pull-down phantom driving unit. The data driving unit is configured to drive a corresponding data output pad in response to a corresponding bit of a data code. The pattern sensing unit is configured to sense a bit pattern of the data code and generate a pattern sensing signal. The pull-down phantom driving unit is configured to pull-down drive a reference phantom node by a phantom sink current that sinks through a pull-down phantom node and changes in intensity in response to the pattern sensing signal. Herein, the pull-down phantom node is connected in parallel to a ground voltage terminal and the data driving units through a ground voltage input pin, and the reference phantom node is connected to a power supply voltage terminal through a power supply voltage input pin.

In accordance with another aspect of the present invention, there is provided a data output circuit of a semiconductor device including a plurality of data driving units, a pattern sensing unit, and a pull-up phantom driving unit. The data driving unit is configured to drive a corresponding data output pad in response to a corresponding bit of a data code. The pattern sensing unit is configured to sense a bit pattern of the data code and generate a pattern sensing signal. The pull-up phantom driving unit is configured to pull-up drive a reference phantom node by a phantom source current that is supplied through a pull-up phantom node and changes in intensity in response to the pattern sensing signal. Herein, the pull-up phantom node is connected in parallel to a power supply voltage terminal and the data driving units through a power supply voltage input pin, and the reference phantom node is connected to a ground voltage terminal through a ground voltage input pin.

In accordance with another aspect of the present invention, there is provided a data output circuit of a semiconductor device including a plurality of data driving units, a pattern sensing unit, a pull-up phantom driving unit, and a pull-down phantom driving unit. The data driving unit is configured to drive a corresponding data output pad in response to a corresponding bit of a data code. The pattern sensing unit is configured to sense a bit pattern of the data code and generate a pattern sensing signal. The pull-up phantom driving unit is configured to pull-up drive a first reference phantom node by a phantom source current that is supplied through a pull-up phantom node and changes in intensity in response to the pattern sensing signal. Herein, the pull-up phantom node is connected in parallel to a power supply voltage terminal and the data driving units through a power supply voltage input pin, and the first reference phantom node is connected to a ground voltage terminal through a ground voltage input pin. The pull-down phantom driving unit is configured to pull-down drive a second reference phantom node by a phantom sink current that sinks through a pull-down phantom node and changes in intensity in response to the pattern sensing signal. Herein, the pull-down phantom node is connected in parallel to the ground voltage terminal and the data driving units through the ground voltage input pin, and the second reference phantom node is connected to the power supply voltage terminal through the power supply voltage input pin.

DESCRIPTION OF SPECIFIC EMBODIMENTS

Other objects and advantages of the present invention can be understood by the following description, and become apparent with reference to the embodiments of the present invention. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Embodiment 1

Figure 1:
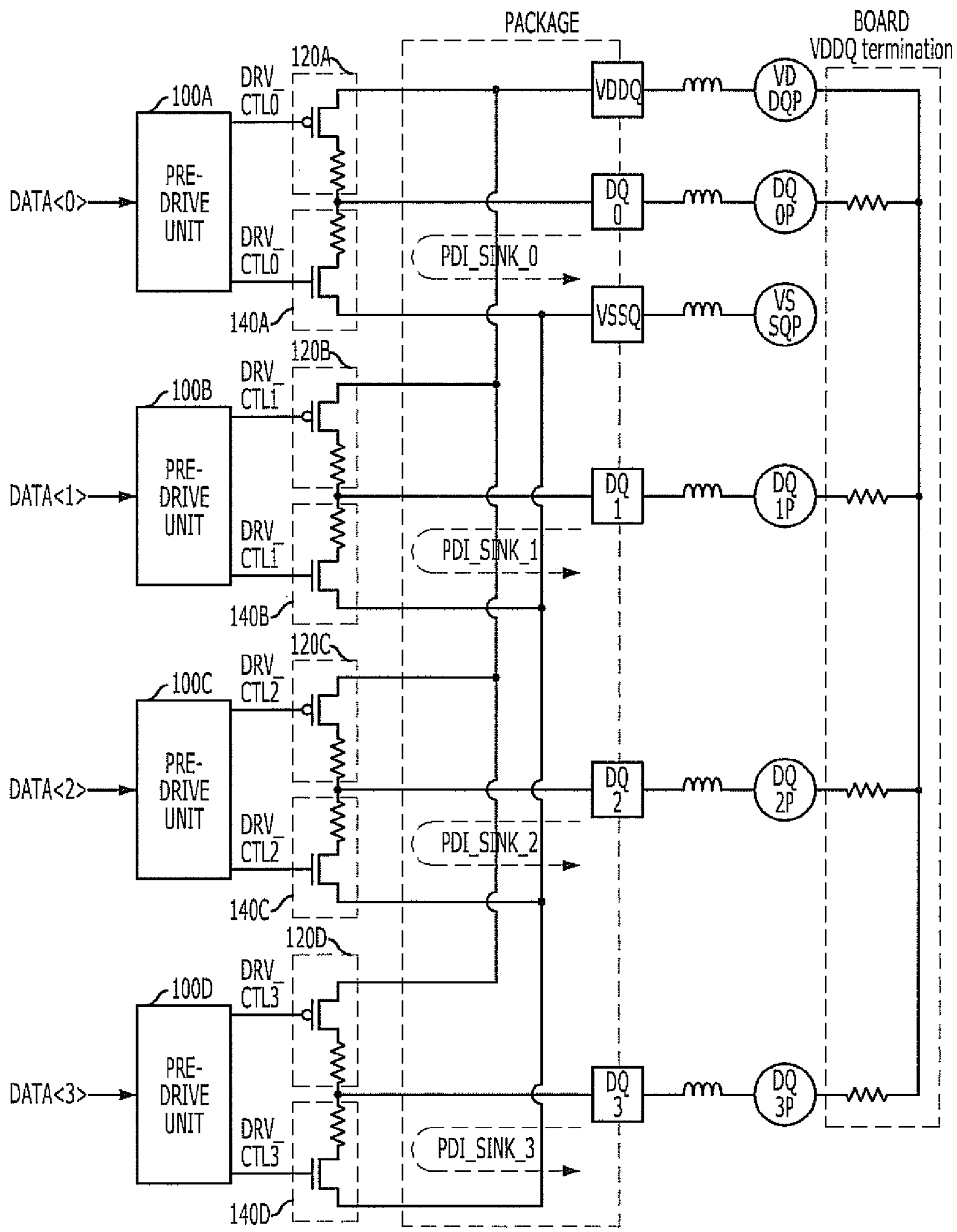
FIG. 1 is a circuit diagram of a conventional data output circuit of a semiconductor device.
Figure 2A:
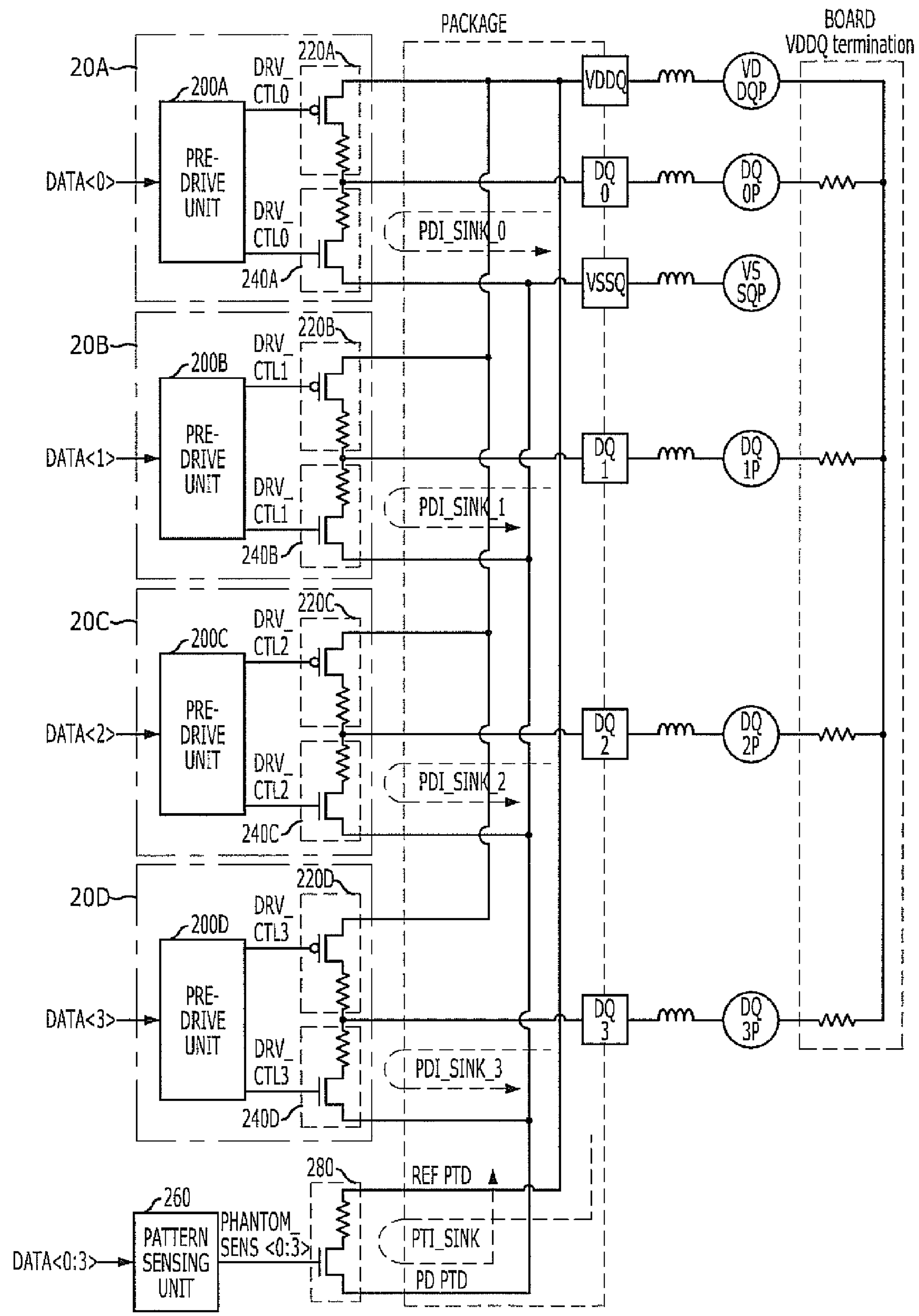
FIG. 2A is a circuit diagram of a data output circuit of a semiconductor device in accordance with a first embodiment of the present invention.

FIG. 2A is a circuit diagram of a data output circuit of a semiconductor device in accordance with a first embodiment of the present invention.

Referring to FIG. 2A, a data output circuit of a semiconductor device in accordance with a first embodiment of the present invention includes a plurality of data driving units 20A, 20B, 20C and 20D, a pattern sensing unit 260, and a pull-down phantom driving unit 280. The data driving units 20A, 20B, 20C and 20D drive a plurality of data output pads DQ0, DQ1, DQ2 and DQ3 in response to a plurality of bits DATA<0>, DATA<1>, DATA<2> and DATA<3> of a data code DATA<0:3>, respectively. Herein, the data output pads DQ0, DQ1, DQ2 and DQ3 are terminated to a power supply voltage terminal VDDQ through a plurality of data output pins DQ0P, DQ1P, DQ2P and DQ3P, respectively. The pattern sensing unit 260 senses a specific pattern of the data code DATA<0:3>. The pull-down phantom driving unit 280 pull-down drives a reference phantom node REF_PTD by a phantom sink current PTI_SINK that sinks through a pull-down phantom node PD_PTD and changes in intensity in response to an output signal PHANTOM_SENS<0:3> of the pattern sensing unit 260. Herein, the pull-down phantom node PD_PTD is connected in parallel to a ground voltage terminal VSSQ and the data driving units 20A, 20B, 20C and 20D through a ground voltage input pin VSSQP, and the reference phantom node REF_PTD is connected to the power supply voltage terminal VDDQ through a power supply voltage input pin VDDQP.

The data driving units 20A, 20B, 20C and 20D include a plurality of pre-drive units 200A, 200B, 200C and 200D, a plurality of pull-up main driving units 220A, 220B, 220C and 220D, and a plurality of pull-down main driving units 240A, 240B, 240C and 240D. The pre-drive units 200A, 200B, 200C and 200D generate a plurality of drive control signals DRV_CTL0, DRV_CTL1, DRV_CTL2 and DRV_CTL3 in response to the bits DATA<0>, DATA<1>, DATA<2> and DATA<3> of the data code DATA<0:3>, respectively. The pull-up main driving units 220A, 220B, 220C and 220D control the connections between the power supply voltage terminal VDDQ and the data output pads DQ0, DQ1, DQ2 and DQ3 in response to the drive control signals DRV_CTL0, DRV_CTL1, DRV_CTL2 and DRV_CTL3, respectively. Herein, the data output pads DQ0, DQ1, DQ2 and DQ3 are terminated to the power supply voltage terminal VDDQ through the data output pins DQ0P, DQ1P, DQ2P and DQ3P, respectively. The pull-down main driving units 240A, 240B, 240C and 240D pull-down drive the data output pads DQ1, DQ1, DQ2 and DQ3 by pull-down sink currents PDI_SINK_0, PDI_SINK_1, PDI_SINK_2 and PDI_SINK_3 of predetermined intensities sinking through the ground voltage terminal VSSQ in response to the drive control signals DRV_CTL0, DRV_CTL1, DRV_CTL2 and DRV_CTL3, respectively. Herein, the data output pads DQ0, DQ1, DQ2 and DQ3 are terminated to the power supply voltage terminal VDDQ through the data output pins DQ0P, DQ1P, DQ2P and DQ3P, respectively.

Figure 2B:
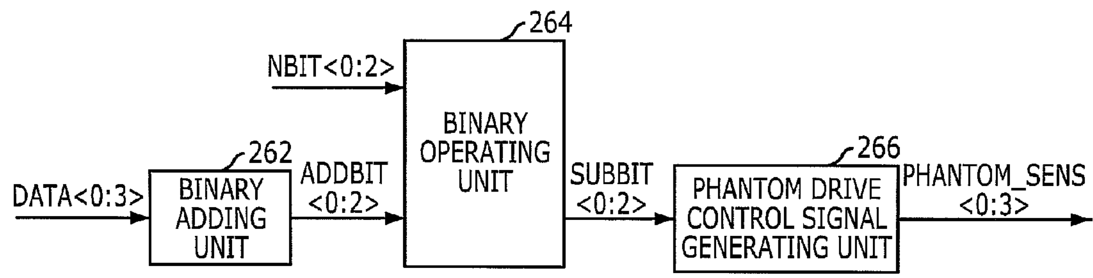
FIG. 2B is a block diagram of a pattern sensing unit of the data output circuit in accordance with the first embodiment of the present invention illustrated in FIG. 2A.

FIG. 2B is a block diagram of the pattern sensing unit 260 of the data output circuit in accordance with the first embodiment of the present invention illustrated in FIG. 2A.

Referring to FIG. 2B, the pattern sensing unit 260 of the data output circuit in accordance with the first embodiment of the present invention includes a binary adding unit 262, a binary operating unit 264, and a phantom drive control signal generating unit 266. The binary adding unit 262 is configured to increase a binary code value ADDBIT<0:2> outputted according to the number of the bits with a value of '1' among the bits DATA<0>, DATA<1>, DATA<2> and DATA<3> of the data code DATA<0:3>. The binary operating unit 264 is configured to calculate a binary code value SUBBIT<0:2> by subtracting the binary code value ADDBIT<0:2> outputted from the binary adding unit 262 from a binary code NBIT<0:2> with a value corresponding to the number of the bits DATA<0>, DATA<1>, DATA<2> and DATA<3> of the data code DATA<0:3>. The phantom drive control signal generating unit 266 is configured to generate a plurality of phantom drive control signals PHANTOM_SENS<0:3> whose logic levels are determined according to the binary code value SUBBIT<0:2> outputted from the binary operating unit 264.

Figure 2C:
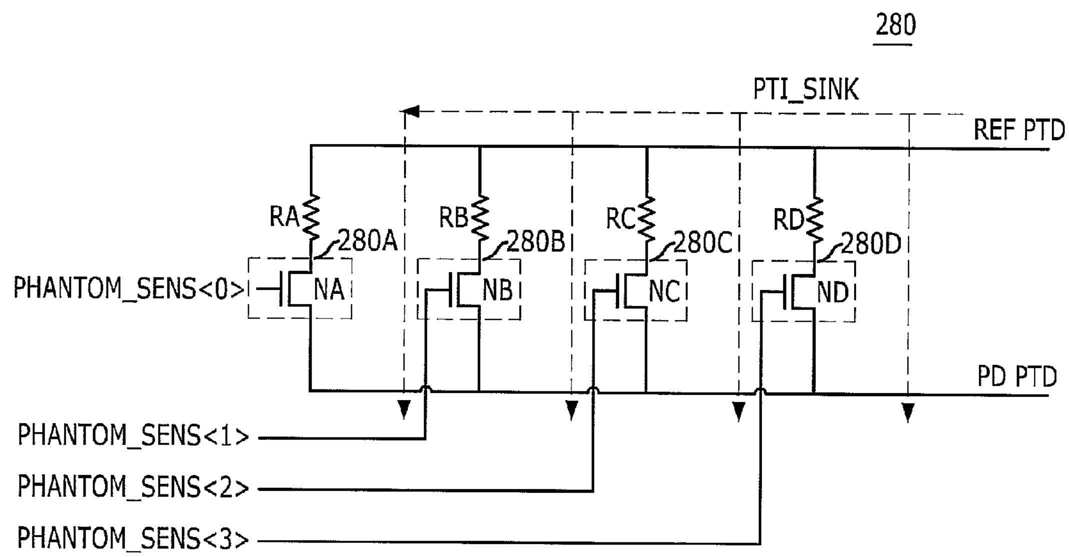
FIG. 2C is a circuit diagram of a pull-down phantom driving unit of the data output circuit in accordance with the first embodiment of the present invention illustrated in FIG. 2A.

FIG. 2C is a circuit diagram of the pull-down phantom driving unit 280 of the data output circuit in accordance with the first embodiment of the present invention illustrated in FIG. 2A.

Referring to FIG. 2C, the pull-down phantom driving unit 280 of the data output circuit in accordance with the first embodiment of the present invention includes a plurality of pull-down phantom drivers 280A, 280B, 280C and 280D. The pull-down phantom drivers 280A, 280B, 280C and 280D are disposed between the pull-down phantom node PD_PTD and the reference phantom node REF_PTD. In response to the phantom drive control signals PHANTOM_SENS<0:3> outputted from the pattern sensing unit 260, the pull-down phantom drivers 280A, 280B, 280C and 280D are selectively enabled to change the intensity of the phantom sink current PTI_SINK.

The pull-down phantom driver 280A includes an NMOS transistor NA that is configured to control the flow of the phantom sink current PTI_SINK from the drain-connected reference phantom node REF_PTD to the source-connected pull-down phantom node PD_PTD in response to the phantom drive control signal PHANTOM_SENS<0> applied to the gate. The pull-down phantom driver, 280B includes an NMOS transistor NB that is configured to control the flow of the phantom sink current PTI_SINK from the drain-connected reference phantom node REF_PTD to the source-connected pull-down phantom node PD_PTD in response to the phantom drive control signal PHANTOM_SENS<1> applied to the gate. The pull-down phantom driver 280C includes an NMOS transistor NC that is configured to control the flow of the phantom sink current PTI_SINK from the drain-connected reference phantom node REF_PTD to the source-connected pull-down phantom node PD_PTD in response to the phantom drive control signal PHANTOM_SENS<2> applied to the gate. The pull-down phantom driver 280D includes an NMOS transistor ND that is configured to control the flow of the phantom sink current PTI_SINK from the drain-connected reference phantom node REF_PTD to the source-connected pull-down phantom node PD_PTD in response to the phantom drive control signal PHANTOM_SENS<3> applied to the gate.

On the basis of the above configuration, an operation of the data output circuit in accordance with the first embodiment of the present invention is described hereinafter.

As illustrated in FIG. 2A, because the data output pads DQ0, DQ1, DQ2, and DQ3 are terminated to the power supply voltage terminal VDDQ through the power supply voltage input pin VDDQP, the data output circuit maintains a power supply voltage (VDD) level while data are not outputted, which is generally called a pseudo open drain termination state.

When the inputted data code DATA<0>/DATA<1>/DATA<2>/DATA<3> has a value of '0', the pre-drive unit 200A/200B/200C/200D outputs the drive control signal DRV_CTL0/DRV_CTL1/DRV_CTL2/DRV_CTL3 with the power supply voltage (VDD) level.

When the drive control signal DRV_CTL0/DRV_CTL1/DRV_CTL2/DRV_CTL3 has the power supply voltage (VDD) level, the pull-up main driving unit 220A/220B/220C/220D forms an open circuit between the power supply voltage terminal VDDQ and the data output pad DQ0/DQ1/DQ2/DQ3, so that the power supply voltage terminal VDDQ and the data output pad DQ0/DQ1/DQ2/DQ3 have different voltage levels. Also, the pull-down main driving unit 240A/240B/240C/240D forms a short circuit between the ground voltage terminal VSSQ and the data output pad DQ0/DQ1/DQ2/DQ3, so that the pull-down sink current PDI_SINK_0/PDI_SINK_1/PDI_SINK_2/PDI_SINK_3 flows to the ground voltage terminal VSSQ from the data output pad DQ0/DQ1/DQ2/DQ3.

That is, when the data code DATA<0>/DATA<1>/DATA<2>/DATA<3> has a value of '0' and thus the drive control signal DRV_CTL0/DRV_CTL1/DRV_CTL2/DRV_CTL3 has the power supply voltage (VDD) level, the power supply voltage terminal VDDQ is disconnected from the data output pad DQ0/DQ1/DQ2/DQ3 and the pull-down sink current PDI_SINK_0/PDI_SINK_1/PDI_SINK_2/PDI_SINK_3 flows to the ground voltage terminal VSSQ from the data output pad DQ0/DQ1/DQ2/DQ3. Therefore, the voltage level of the data output pad DQ0/DQ1/DQ2/DQ3 becomes lower than that of the power supply voltage terminal VDDQ, thus causing a logic low level.

For reference, because the power supply voltage terminal VDDQ is disconnected from the data output pad DQ0/DQ1/DQ2/DQ3, even when the data output pad DQ0/DQ1/DQ2/DQ3 is terminated to the power supply voltage terminal VDDQ, the pull-down sink current PDI_SINK_0/PDI_SINK_1/PDI_SINK_2/PDI_SINK_3 flows from the data output pad DQ0/DQ1/DQ2/DQ3 to the ground voltage terminal VSSQ and thus the voltage level of the data output pad DQ0/DQ1/DQ2/DQ3 becomes lower than that of the power supply voltage terminal VDDQ.

When the inputted data code DATA<0>/DATA<1>/DATA<2>/DATA<3> has a value of '1', the pre-drive unit

200A/200B/200C/200D outputs the drive control signal DRV_CTL0/DRV_CTL1/DRV_CTL2/DRV_CTL3 with the ground voltage (VSS) level.

When the drive control signal DRV_CTL0/DRV_CTL1/DRV_CTL2/DRV_CTL3 has the ground voltage (VSS) level, the pull-up main driving unit 220A/220B/220C/220D forms a short circuit between the power supply voltage terminal VDDQ and the data output pad DQ0/DQ1/DQ2/DQ3, so that the power supply voltage terminal VDDQ and the data output pad DQ0/DQ1/DQ2/DQ3 have the same power supply voltage (VDD) level. Also, the pull-down main driving unit 240A/240B/240C/240D forms an open circuit between the ground voltage terminal VSSQ and the data output pad DQ0/DQ1/DQ2/DQ3, so that the pull-down sink current PDI_SINK_0/PDI_SINK_1/PDI_SINK_2/PDI_SINK_3 does not flow to the ground voltage terminal VSSQ from the data output pad DQ0/DQ1/DQ2/DQ3.

That is, when the data code DATA<0>/DATA<1>/DATA<2>/DATA<3> has a value of '1' and thus the drive control signal DRV_CTL0/DRV_CTL1/DRV_CTL2/DRV_CTL3 has the ground voltage (VSS) level, the data output pad DQ0/DQ1/DQ2/DQ3 and the power supply voltage terminal VDDQ having the same power supply voltage (VDD) level are connected to each other and the ground voltage terminal VSSQ is disconnected from the data output pad DQ0/DQ1/DQ2/DQ3, so that the pull-down sink current PDI_SINK_0/PDI_SINK_1/PDI_SINK_2/PDI_SINK_3 does not flow to the ground voltage terminal VSSQ from the data output pad DQ0/DQ1/DQ2/DQ3. Therefore, the voltage level of the data output pad DQ0/DQ1/DQ2/DQ3 becomes equal to the voltage level of the power supply voltage terminal VDDQ, thus causing a logic high level.

For reference, no current flows from the power supply voltage terminal VDDQ to the data output pad DQ0/DQ1/DQ2/DQ3, because the ground voltage terminal VSSQ is disconnected from the data output pad DQ0/DQ1/DQ2/DQ3 and the data output pad DQ0/DQ1/DQ2/DQ3 automatically becomes the power supply voltage (VDD) level through the termination-connected power supply voltage terminal VDDQ. That is, no current flows from the power supply voltage terminal VDDQ with the same power supply voltage VDD to the data output pad DQ0/DQ1/DQ2/DQ3.

The binary adding unit 262 of the pattern sensing unit 260 determines the binary code value ADDBIT<0:2> outputted according to the number of the bits with a value of '1' among the bits DATA<0>, DATA<1>, DATA<2> and DATA<3> of the data code DATA<0:3>, in the following method.

First, the binary code ADDBIT<0:2> outputted from the binary adding unit 262 has an initial value of '000'. Under the state, the binary adding unit 262 detects the bits DATA<0>, DATA<1>, DATA<2> and DATA<3> of the data code DATA<0:3> sequentially one by one. If the detect bit value is '1', the binary adding unit 262 increases the value of the outputted binary code ADDBIT<0:2>; and if the detect bit value is '0', the binary adding unit 262 does not increase the value of the outputted binary code ADDBIT<0:2>. In this way, when the bits DATA<0>, DATA<1>, DATA<2> and DATA<3> of the data code DATA<0:3> are all detected, the value of the finally outputted binary code ADDBIT<0:2> is determined.

For example, if there is no bit with a value of '1' among the bits DATA<0>, DATA<1>, DATA<2> and DATA<3> of the data code DATA<0:3>, the finally outputted binary code ADDBIT<0:2> maintains the initial value '000'. If there is one bit with a value of '1' among the bits DATA<0>, DATA<1>, DATA<2> and DATA<3> of the data code DATA<0:3>, the value of the finally outputted binary code ADDBIT<0:2> becomes '001'. If there are two bits with a value of '1' among the bits DATA<0>, DATA<1>, DATA<2> and DATA<3> of the data code DATA<0:3>, the value of the finally outputted binary code ADDBIT<0:2> becomes '010'. If there are three bits with a value of '1' among the bits DATA<0>, DATA<1>, DATA<2> and DATA<3> of the data code DATA<0:3>, the value of the finally outputted binary code ADDBIT<0:2> becomes '011'. If there are four bits with a value of '1' among the bits DATA<0>, DATA<1>, DATA<2> and DATA<3> of the data code DATA<0:3>, the value of the finally outputted binary code ADDBIT<0:2> becomes '100'.

As described above, the value of the outputted binary code ADDBIT<0:2> may be determined by detecting the bits DATA<0>, DATA<1>, DATA<2> and DATA<3> of the data code DATA<0:3> sequentially one by one. Also, all of the bits DATA<0>, DATA<1>, DATA<2> and DATA<3> of the data code DATA<0:3> may be simultaneously detected, and the values of the binary codes ADDBIT<0:2> may be simultaneously increased according to the detection results.

The binary operating unit 264 of the pattern sensing unit 260 calculate the binary code value SUBBIT<0:2> by subtracting the binary code value ADDBIT<0:2> outputted from the binary adding unit 262 from the binary code NBIT<0:2> with a value corresponding to the number of the bits DATA<0>, DATA<1>, DATA<2> and DATA<3> of the data code DATA<0:3>, in the following method.

First, the binary code NBIT<0:2> with a value corresponding to the number of the bits DATA<0>, DATA<1>, DATA<2> and DATA<3> of the data code DATA<0:3> has a value of '100'. In another embodiment, if there are more bits, the value of the binary code NBIT<0:2> with a value corresponding to the number of the bits DATA<0>, DATA<1>, DATA<2> and DATA<3> of the data code DATA<0:3> may also be further increased.

In this state, the binary operating unit 264 determines the value of the value of the outputted binary code SUBBIT<0:2> by subtracting the binary code value ADDBIT<0:2> outputted from the binary adding unit 262 from the binary code NBIT<0:2> with a value corresponding to the number of the bits DATA<0>, DATA<1>, DATA<2> and DATA<3> of the data code DATA<0:3>.

For example, if the value of the binary code ADDBIT<0:2> outputted from the binary adding unit 262 is '000', the value of the outputted binary code SUBBIT<0:2> maintains a value of '100'. If the value of the binary code ADDBIT<0:2> outputted from the binary adding unit 262 is '001', the value of the outputted binary code SUBBIT<0:2> becomes '011'. If the value of the binary code ADDBIT<0:2> outputted from the binary adding unit 262 is '010', the value of the outputted binary code SUBBIT<0:2> becomes '010'. If the value of the binary code ADDBIT<0:2> outputted from the binary adding unit 262 is '011', the value of the outputted binary code SUBBIT<0:2> becomes '001'. If the value of the binary code ADDBIT<0:2> outputted from the binary adding unit 262 is '100', the value of the outputted binary code SUBBIT<0:2> becomes '000'.

A detailed circuit for subtracting the binary code value ADDBIT<0:2> outputted from the binary adding unit 262 from the value of the binary code NBIT<0:2> with a value corresponding to the number of the bits DATA<0>, DATA<1>, DATA<2> and DATA<3> of the data code DATA<0:3> is well known in the art, and thus its description is not provided herein.

The phantom drive control signal generating unit 266 of the pattern sensing unit 260 determines the logic levels of the phantom drive control signals PHANTOM_SENS<0>, PHANTOM_SENS<1>, PHANTOM_SENS<2> and PHANTOM_SENS<3> according to the binary code SUBBIT<0:2> outputted from the binary operating unit 264, in the following method.

First, in the configuration of the pull-down phantom driving unit 280 described above, the intensity of the phantom sink current PTI_SINK increases with an increase in the number of the signals with a logic high level among the phantom drive control signals PHANTOM_SENS<0>, PHANTOM_SENS<1>, PHANTOM_SENS<2> and PHANTOM_SENS<3> and decreases with an increase in the number of the signals with a logic low level among the phantom drive control signals PHANTOM_SENS<0>, PHANTOM_SENS<1>, PHANTOM_SENS<2> and PHANTOM_SENS<3>.

Also, the number of the bits with a value of '0' among the data code DATA<0:3> increases with an increase in the value of the binary code SUBBIT<0:2> outputted from the binary operating unit 264 and decreases with a decrease in the value of the binary code SUBBIT<0:2> outputted from the binary operating unit 264. Therefore, the intensity of the phantom sink current PTI_SINK may decrease with an increase in the value of the binary code SUBBIT<0:2> outputted from the binary operating unit 264 and may increase with a decrease in the value of the binary code SUBBIT<0:2> outputted from the binary operating unit 264.

For example, if the binary code SUBBIT<0:2> outputted from the binary operating unit 264 has a maximum value of '100', because the intensity of the phantom sink current PTI_SINK must have a minimum value, all of the phantom drive control signals PHANTOM_SENS<0>, PHANTOM_SENS<1>, PHANTOM_SENS<2> and PHANTOM_SENS<3> will have a logic low level.

If the binary code SUBBIT<0:2> outputted from the binary operating unit 264 has a value of '011', the phantom drive control signals PHANTOM_SENS<1>, PHANTOM_SENS<2> and PHANTOM_SENS<3> will have a logic low level and the phantom control signal PHANTOM_SENS<0> will have a logic high level.

If the binary code SUBBIT<0:2> outputted from the binary operating unit 264 has a value of '010', the phantom drive control signals PHANTOM_SENS<2> and PHANTOM_SENS<3> will have a logic low level and the phantom control signals PHANTOM_SENS<0> and PHANTOM_SENS<1> will have a logic high level.

If the binary code SUBBIT<0:2> outputted from the binary operating unit 264 has a value of '001', the phantom drive control signal PHANTOM_SENS<3> will have a logic low level and the phantom control signals PHANTOM_SENS<0>, PHANTOM_SENS<1> and PHANTOM_SENS<2> will have a logic high level.

If the binary code SUBBIT<0:2> outputted from the binary operating unit 264 has a maximum value of '000', all of the phantom drive control signals PHANTOM_SENS<0>, PHANTOM_SENS<1>, PHANTOM_SENS<2> and PHANTOM_SENS<3> will have a logic high level.

The pull-down phantom drivers 280A, 280B, 280C and 280D of the pull-down phantom driving unit 280 drive the reference phantom node REF_PTD by the phantom sink current PTI_SINK that sinks through the pull-down phantom node PD_PTD.

Herein, each of the pull-down phantom drivers 280A, 280B, 280C and 280D has a predetermined driving force. Therefore, the driving force for the reference phantom node REF_PTD increases with an increase in the number of the enabled drivers among the pull-down phantom drivers 280A, 280B, 280C and 280D. That is, the intensity of the phantom sink current PTI_SINK increases with an increase in the number of the enabled drivers among the pull-down phantom drivers 280A, 280B, 280C and 280D.

On the contrary, the driving force for the reference phantom node REF_PTD decreases with a decrease in the number of the enabled drivers among the pull-down phantom drivers 280A, 280B, 280C and 280D. That is, the intensity of the phantom sink current PTI_SINK decreases with a decrease in the number of the enabled drivers among the pull-down phantom drivers 280A, 280B, 280C and 280D.

The pull-down phantom node PD_PTD, the phantom sink current PTI_SINK of which is sunk by the pull-down phantom driving unit 280, is connected in parallel to the data output pads DQ0, DQ1, DQ2 and DQ3 with respect to the ground voltage terminal VSSQ. Therefore, the phantom sink current PTI_SINK is outputted to the ground voltage terminal VSSQ after being combined with the pull-down sink currents PDI_SINK_0, PDI_SINK_1, PDI_SINK_2 and PDI_SINK_3 flowing from the data output pads DQ0, DQ1, DQ2 and DQ3 to the ground voltage terminal VSSQ. That is, with respect to the ground voltage terminal VSSQ, the pull-down sink currents PDI_SINK_0, PDI_SINK_1 PDI_SINK_2 and PDI_SINK_3 are not discriminated from the phantom sink current PTI_SINK.

Consequently, the operation of the data output circuit in accordance with the first embodiment of the present invention is summarized as follows.

First, the pre-drive units 200A, 200B, 200C and 200D, the pull-up driving units 220A, 220B, 220C and 220D, and the pull-down driving units 240A, 240B, 240C and 240D operate in the same way as those of the conventional data output circuit. That is, the intensity of the pull-down sink currents PDI_SINK_0, PDI_SINK_1, PDI_SINK_2 and PDI_SINK_3 flowing into the ground voltage terminal VSSQ increases with an increase in the number of the bits with a value of '0' among the bits of the data code DATA<0:3>. The intensity of the pull-down sink currents PDI_SINK_0, PDI_SINK_1, PDI_SINK_2 and PDI_SINK_3 flowing into the ground voltage terminal VSSQ decreases with a decrease in the number of the bits with a value of '0' among the bits of the data code DATA<0:3>.

In this way, even when an amount of the pull-down sink currents PDI_SINK_0, PDI_SINK_1, PDI_SINK_2 and PDI_SINK_3 flowing from the pull-up driving units 220A, 220B, 220C and 220D and the pull-down driving units 240A, 240B, 240C and 240D into the ground voltage terminal VSSQ changes according to the values of the bits of the data code DATA<0:3>, the total current flowing into the ground voltage terminal VSSQ in the data output circuit of the first embodiment of the present invention may maintain the same intensity. The reason for this is that the intensity of the pull-down phantom current PTI_SINK flowing from the power supply voltage terminal VDDQ to the ground voltage terminal VSSQ by the pull-down phantom driving unit 280 changes according to the values of the bits of the data code DATA<0:3>.

That is, the pull-down phantom driving unit 280 decreases the intensity of the pull-down phantom current PTI_SINK with an increase in the number of the bits with a value of '0' among the bits of the data code DATA<0:3> and increases the intensity of the pull-down phantom current PTI_SINK with a decrease in the number of the bits with a value of '0' among the bits of the data code DATA<0:3>, so that the sum of the intensity of the pull-down phantom current and the intensity of the pull-down sink currents PDI_SINK_0, PDI_SINK_1, PDI_SINK_2 and PDI_SINK_3 may have the same value.

Thus, regardless of whether all the values of the bits of the data code DATA<0:3> switch from '1' to '0' or from '0' to '1', the data output circuit of the first embodiment of the present invention may maintain the constant intensity of the current flowing to the ground voltage terminal VSSQ, thus making it possible to suppress a simultaneous switching output (SSO) noise in an effective manner.

Embodiment 2

Figure 3A:
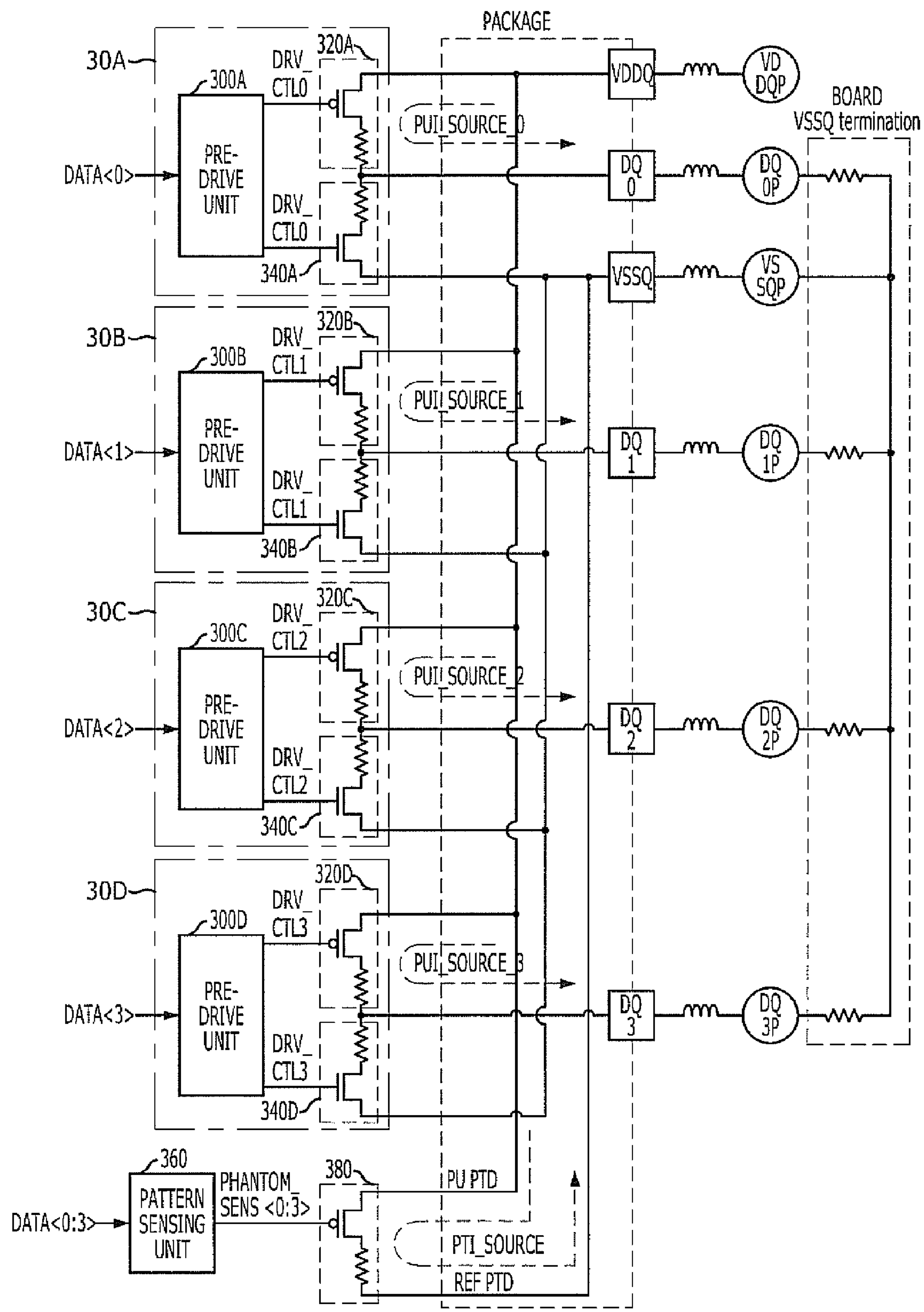
FIG. 3A is a circuit diagram of a data output circuit of a semiconductor device in accordance with a second embodiment of the present invention.

FIG. 3A is a circuit diagram of a data output circuit of a semiconductor device in accordance with a second embodiment of the present invention.

Referring to FIG. 3A, a data output circuit of a semiconductor device in accordance with a second embodiment of the present invention includes a plurality of data driving units 30A, 30B, 30C and 30D, a pattern sensing unit 360, and a pull-up phantom driving unit 380. The data driving units 30A, 30B, 30C and 30D drive a plurality of data output pads DQ0, DQ1, DQ2 and DQ3 in response to a plurality of bits DATA<0>, DATA<1>, DATA<2> and DATA<3> of a data code DATA<0:3>, respectively. Herein, the data output pads DQ0, DQ1, DQ2 and DQ3 are terminated to a ground voltage terminal VSSQ through a plurality of data output pins DQ0P, DQ1P, DQ2P and DQ3P, respectively. The pattern sensing unit 360 senses a specific pattern of the data code DATA<0:3>. The pull-up phantom driving unit 380 pull-up drives a reference phantom node REF_PTD by a phantom source current PTI_SOURCE flowing through a pull-up phantom node PU_PTD and changing in intensity in response to an output signal PHANTOM_SENS<0:3> of the pattern sensing unit 360. Herein, the pull-up phantom node PU_PTD is connected in parallel to a power supply voltage terminal VDDQ and the data driving units 30A, 30B, 30C and 30D through a power supply voltage input pin VDDQP, and the reference phantom node REF_PTD is connected to the ground voltage terminal VSSQ through a ground voltage input pin VSSQP.

The data driving units 30A, 30B, 30C and 30D include a plurality of pre-drive units 300A, 300B, 300C and 300D, a plurality of pull-down main driving units 340A, 340B, 340C and 340D, and a plurality of pull-up main driving units 320A, 320B, 320C and 320D. The pre-drive units 300A, 300B, 300C and 300D generate a plurality of drive control signals DRV_CTL0, DRV_CTL1, DRV_CTL2 and DRV_CTL3 in response to the bits DATA<0>, DATA<1>, DATA<2> and DATA<3> of the data code DATA<0:3>, respectively. The pull-down main driving units 340A, 340B, 340C and 340D control the connections between the ground voltage terminal VSSQ and the data output pads DQ0, DQ1, DQ2 and DQ3 in response to the drive control signals DRV_CTL0, DRV_CTL1, DRV_CTL2 and DRV_CTL3, respectively. Herein, the data output pads DQ0, DQ1, DQ2 and DQ3 are terminated to the ground voltage terminal VSSQ through the data output pins DQ0P, DQ1P, DQ2P and DQ3P, respectively. The pull-up main driving units 320A, 320B, 320C and 320D pull-up drive the data output pads DQ0, DQ1, DQ2 and DQ3 by pull-up source currents PUI_SOURCE_0, PUI_SOURCE 1, PUI_SOURCE 2 and PUI_SOURCE_3 of predetermined intensities supplied through the power supply voltage terminal VDDQ in response to the drive control signals DRV_CTL0, DRV_CTL1, DRV_CTL2 and DRV_CTL3, respectively. Herein, the data output pads DQ0, DQ1, DQ2 and DQ3 are terminated to the ground voltage terminal VSSQ through the data output pins DQ0P, DQ1P, DQ2P and DQ3P, respectively.

Figure 3B:
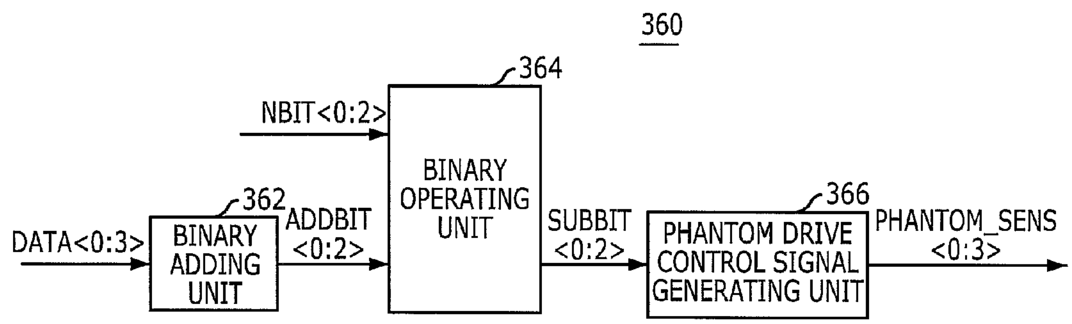
FIG. 3B is a block diagram of a pattern sensing unit of the data output circuit in accordance with the second embodiment of the present invention illustrated in FIG. 3A.

FIG. 3B is a block diagram of the pattern sensing unit 360 of the data output circuit in accordance with the second embodiment of the present invention illustrated in FIG. 3A.

Referring to FIG. 3B, the pattern sensing unit 360 of the data output circuit in accordance with the second embodiment of the present invention includes a binary adding unit 362, a binary operating unit 364, and a phantom drive control signal generating unit 366. The binary adding unit 362 is configured to increase a binary code value ADDBIT<0:2> outputted according to the number of the bits with a value of '0' among the bits DATA<0>, DATA<1>, DATA<2> and DATA<3> of the data code DATA<0:3>. The binary operating unit 364 is configured to calculate a binary code value SUBBIT<0:2> by subtracting the binary code value ADDBIT<0:2> outputted from the binary adding unit 362 from a binary code NBIT<0:2> with a value corresponding to the number of the bits DATA<0>, DATA<1>, DATA<2> and DATA<3> of the data code DATA<0:3>. The phantom drive control signal generating unit 366 is configured to generate a plurality of phantom drive control signals PHANTOM_SENS<0:3> whose logic levels are determined according to the binary code value SUBBIT<0:2> outputted from the binary operating unit 364.

Figure 3C:
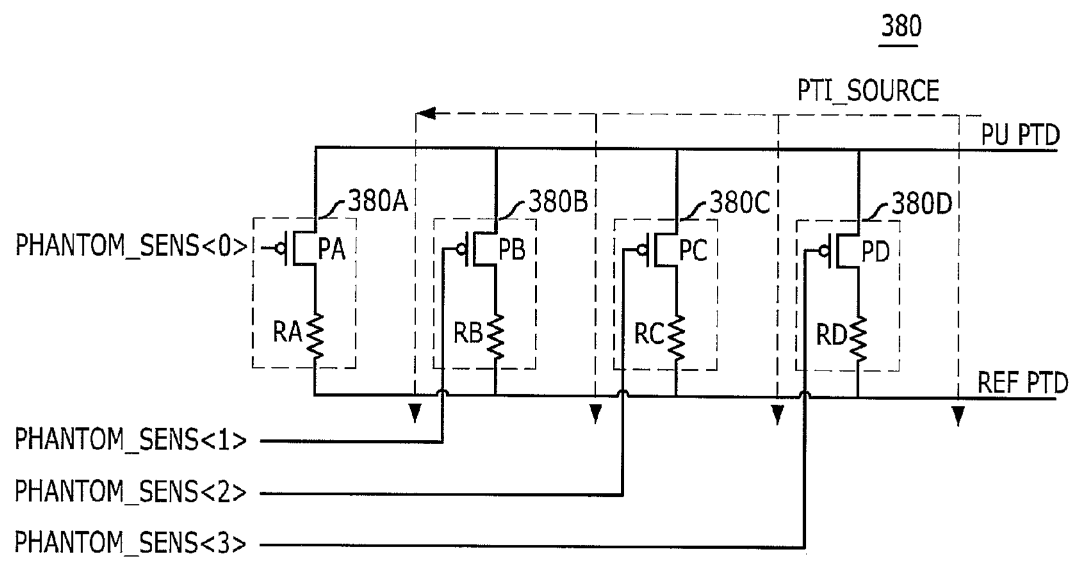
FIG. 3C is a circuit diagram of a pull-up phantom driving unit of the data output circuit in accordance with the second embodiment of the present invention illustrated in FIG. 3A.

FIG. 3C is a circuit diagram of the pull-up phantom driving unit 380 of the data output circuit in accordance with the second embodiment of the present invention illustrated in FIG. 3A.

Referring to FIG. 3C, the pull-up phantom driving unit 380 of the data output circuit in accordance with the second embodiment of the present invention includes a plurality of pull-up phantom drivers 380A, 380B, 380C and 380D. The pull-up phantom drivers 380A, 380B, 380C and 380D are disposed between the pull-up phantom node PU_PTD and the reference phantom node REF_PTD. In response to the phantom drive control signals PHANTOM_SENS<0:3> outputted from the pattern sensing unit 360, the pull-up phantom drivers 380A, 380B, 380C and 380D are selectively enabled to change the intensity of the phantom source current PTI_SOURCE.

The pull-up phantom driver 380A includes a PMOS transistor PA that is configured to control the flow of the phantom source current PTI_SOURCE from the source-connected pull-up phantom node PU_PTD to the drain-connected reference phantom node REF_PTD in response to the phantom drive control signal PHANTOM_SENS<0> applied to the gate. The pull-up phantom driver 380B includes a PMOS transistor PB that is configured to control the flow of the phantom source current PTI_SOURCE from the source-connected pull-up phantom node PU_PTD to the drain-connected reference phantom node REF_PTD in response to the phantom drive control signal PHANTOM_SENS<1> applied to the gate. The pull-up phantom driver 380C includes a PMOS transistor PC that is configured to control the flow of the phantom source current PTI_SOURCE from the source-connected pull-up phantom node PU_PTD to the drain-connected reference phantom node REF_PTD in response to the phantom drive control signal PHANTOM_SENS<2> applied to the gate. The pull-up phantom driver 380D includes a PMOS transistor PD that is configured to control the flow of the phantom source current PTI_SOURCE from the source-connected pull-up phantom node PU_PTD to the drain-connected reference phantom node REF_PTD in response to the phantom drive control signal PHANTOM_SENS<3> applied to the gate.

Based on the above configuration, an operation of the data output circuit in accordance with the second embodiment of the present invention is described hereinafter.

As illustrated in FIG. 3A, because the data output pads DQ0, DQ1, DQ2, and DQ3 are terminated to the ground voltage terminal VSSQ through the ground voltage input pin VSSQP, the data output circuit maintains a ground voltage (VSS) level while data are not outputted, which is generally called a pseudo open source termination state.

When the inputted data code DATA<0>/DATA<1>/DATA<2>/DATA<3> has a value of '0', the pre-drive unit 300A/300B/300C/300D outputs the drive control signal DRV_CTL0/DRV_CTL1/DRV_CTL2/DRV_CTL3 with the power supply voltage (VDD) level.

When the drive control signal DRV_CTL0/DRV_CTL1/DRV_CTL2/DRV_CTL3 has the power supply voltage (VDD) level, the pull-up main driving unit 320A/320B/320C/320D forms an open circuit between the power supply voltage terminal VDDQ and the data output pad DQ0/DQ1/DQ2/DQ3, so that the pull-up source current PUI_SOURCE_0/PUI_SOURCE_1/PUI_SOURCE_2/PUI_SOURCE_3 does not flow from the power supply voltage terminal VDDQ to the data output pad DQ0/DQ1/DQ2/DQ3. Also, the pull-down main driving unit 240A/240B/240C/240D forms a short circuit between the ground voltage terminal VSSQ and the data output pad DQ0/DQ1/DQ2/DQ3, so that the ground voltage terminal VSSQ and the data output pad DQ0/DQ1/DQ2/DQ3 have the same ground voltage (VSS) level.

That is, when the data code DATA<0>/DATA<1>/DATA<2>/DATA<3> has a value of '0' and thus the drive control signal DRV_CTL0/DRV_CTL1/DRV_CTL2/DRV_CTL3 has the power supply voltage (VDD) level, the power supply voltage terminal VDDQ and the data output pad DQ0/DQ1/DQ2/DQ3 having different voltage levels are disconnected from each other, so that the pull-up source current PUI_SOURCE_0/PUI_SOURCE_1/PUI_SOURCE_2/PUI_SOURCE_3 does not flow. Also, the ground voltage terminal VSSQ and the data output pad DQ0/DQ1/DQ2/DQ3 having the same ground voltage (VSS) level are disconnected from each other, so that the data output pad DQ0/DQ1/DQ2/DQ3 maintains the same voltage level as the ground voltage (VSS) level of the ground voltage terminal VSSQ. That is, the data output pad DQ0/DQ1/DQ2/DQ3 has a logic low level.

For reference, no current flows to the ground voltage terminal VSSQ or from data output pad DQ0/DQ1/DQ2/DQ3, because the power supply voltage terminal VDDQ is disconnected from the data output pad DQ0/DQ1/DQ2/DQ3 and the data output pad DQ0/DQ1/DQ2/DQ3 automatically becomes the ground voltage (VSS) level through the termination-connected ground voltage terminal VSSQ. That is, no current flows from the data output pad DQ0/DQ1/DQ2/DQ3 with the same ground voltage (VSS) level to the ground voltage terminal VSSQ.

When the inputted data code DATA<0>/DATA<1>/DATA<2>/DATA<3> has a value of '1', the pre-drive unit 300A/300B/300C/300D outputs the drive control signal DRV_CTL0/DRV_CTL1/DRV_CTL2/DRV_CTL3 with the ground voltage (VSS) level.

When the drive control signal DRV_CTL0/DRV_CTL1/DRV_CTL2/DRV_CTL3 has the ground voltage (VSS) level, the pull-up main driving unit 320A/320B/320C/320D forms a short circuit between the power supply voltage terminal VDDQ and the data output pad DQ0/DQ1/DQ2/DQ3, so that the pull-up source current PUI_SOURCE_0/PUI_SOURCE_1/PUI_SOURCE_2/PUI_SOURCE_3 flows from the power supply voltage terminal VDDQ to the data output pad DQ0/DQ1/DQ2/DQ3. Also, the pull-down main driving unit 340A/340B/340C/340D forms an open circuit between the ground voltage terminal VSSQ and the data output pad DQ0/DQ1/DQ2/DQ3, so that the ground voltage terminal VSSQ and the data output pad DQ0/DQ1/DQ2/DQ3 have different voltage levels.

That is, when the data code DATA<0>/DATA<1>/DATA<2>/DATA<3> has a value of '1' and thus the drive control signal DRV_CTL0/DRV_CTL1/DRV_CTL2/DRV_CTL3 has the ground voltage (VSS) level, the data output pad DQ0/DQ1/DQ2/DQ3 and the power supply voltage terminal VDDQ having different voltage levels are connected to each other, so that the pull-up source current PUI_SOURCE_0/PUI_SOURCE_1/PUI_SOURCE_2/PUI_SOURCE_3 flows therethrough. Also, the ground voltage terminal VSSQ and the data output pad DQ0/DQ1/DQ2/DQ3 having the same ground voltage (VSS) level are disconnected from each other, so that the data output pad DQ0/DQ1/DQ2/DQ3 has a higher voltage level than the ground voltage (VSS) level of the ground voltage terminal VSSQ. That is, the data output pad DQ0/DQ1/DQ2/DQ3 has a logic high level.

Even when the data output pad DQ0/DQ1/DQ2/DQ3 is terminated to the ground voltage terminal VSSQ, because the ground voltage terminal VSSQ is disconnected from the data output pad DQ0/DQ1/DQ2/DQ3, the data output pad DQ0/DQ1/DQ2/DQ3 has a higher voltage level than the ground voltage (VSS) level due to the flow of the pull-up source current PUI_SOURCE_0/PUI_SOURCE_1/PUI_SOURCE_2/PUI_SOURCE_3 from the power supply voltage terminal VDDQ to the data output pad DQ0/DQ1/DQ2/DQ3.

The binary adding unit 362 of the pattern sensing unit 360 determines the binary code value ADDBIT<0:2> outputted according to the number of the bits with a value of '0' among the bits DATA<0>, DATA<1>, DATA<2> and DATA<3> of the data code DATA<0:3>, in the following method.

First, the binary code ADDBIT<0:2> outputted from the binary adding unit 362 has an initial value of '000'. In this state, the binary adding unit 362 detects the bits DATA<0>, DATA<1>, DATA<2> and DATA<3> of the data code DATA<0:3> sequentially one by one. If the detect bit value is '0', the binary adding unit 362 increases the value of the outputted binary code ADDBIT<0:2>; and if the detect bit value is '1', the binary adding unit 362 does not increase the value of the outputted binary code ADDBIT<0:2>. In this way, when the bits DATA<0>, DATA<1>, DATA<2> and DATA<3> of the data code DATA<0:3> are all detected, the value of the finally outputted binary code ADDBIT<0:2> is determined.

For example, if there is no bit with a value of '0' among the bits DATA<0>, DATA<1>, DATA<2>, and DATA<3> of the data code DATA<0:3>, the finally outputted binary code ADDBIT<0:2> maintains the initial value '000'. If there is one bit with a value of '0' among the bits DATA<0>, DATA<1>, DATA<2> and DATA<3> of the data code DATA<0:3>, the value of the finally outputted binary code ADDBIT<0:2> becomes '001'. If there are two bits with a value of '0' among the bits DATA<0>, DATA<1>, DATA<2> and DATA<3> of the data code DATA<0:3>, the value of the finally outputted binary code ADDBIT<0:2> becomes '010'. If there are three bits with a value of '0' among the bits DATA<0>, DATA<1>, DATA<2> and DATA<3> of the data code DATA<0:3>, the value of the finally outputted binary code ADDBIT<0:2> becomes '011'. If there are four bits with a value of '0' among the bits DATA<0>, DATA<1>, DATA<2> and DATA<3> of the data code DATA<0:3>, the value of the finally outputted binary code ADDBIT<0:2> becomes '100'.

As described above, the value of the outputted binary code ADDBIT<0:2> may be determined by detecting the bits DATA<0>, DATA<1>, DATA<2> and DATA<3> of the data code DATA<0:3> sequentially one by one. Also, all of the bits DATA<0>, DATA<1>, DATA<2> and DATA<3> of the data code DATA<0:3> may be simultaneously detected, and the values of the binary codes ADDBIT<0:2> may be simultaneously increased according to the detection results.

The binary operating unit 364 of the pattern sensing unit 360 calculate the binary code value SUBBIT<0:2> by subtracting the binary code value ADDBIT<0:2> outputted from the binary adding unit 362 from the binary code NBIT<0:2> with a value corresponding to the number of the bits DATA<0>, DATA<1>, DATA<2> and DATA<3> of the data code DATA<0:3>, in the following method.

First, the binary code NBIT<0:2> with a value corresponding to the number of the bits DATA<0>, DATA<1>, DATA<2> and DATA<3> of the data code DATA<0:3> has a value of '100'. In another embodiment, if there are more bits, the value of the binary code NBIT<0:2> with a value corresponding to the number of the bits DATA<0>, DATA<1>, DATA<2> and DATA<3> of the data code DATA<0:3> may also be further increased.

In this case, the binary operating unit 364 determines the value of the value of the outputted binary code SUBBIT<0:2> by subtracting the binary code value ADDBIT<0:2> outputted from the binary adding unit 362 from the binary code NBIT<0:2> with a value corresponding to the number of the bits DATA<0>, DATA<1>, DATA<2> and DATA<3> of the data code DATA<0:3>.

For example, if the value of the binary code ADDBIT<0:2> outputted from the binary adding unit 262 is '000', the value of the outputted binary code SUBBIT<0:2> maintains a value of '100'. If the value of the binary code ADDBIT<0:2> outputted from the binary adding unit 362 is '001', the value of the outputted binary code SUBBIT<0:2> becomes '011'. If the value of the binary code ADDBIT<0:2> outputted from the binary adding unit 362 is '010', the value of the outputted binary code SUBBIT<0:2> becomes '010'. If the value of the binary code ADDBIT<0:2> outputted from the binary adding unit 362 is '011', the value of the outputted binary code SUBBIT<0:2> becomes '001'. If the value of the binary code ADDBIT<0:2> outputted from the binary adding unit 362 is '100', the value of the outputted binary code SUBBIT<0:2> becomes '000'.

A detailed circuit for subtracting the binary code value ADDBIT<0:2> outputted from the binary adding unit 362 from the value of the binary code NBIT<0:2> with a value corresponding to the number of the bits DATA<0>, DATA<1>, DATA<2> and DATA<3> of the data code DATA<0:3> is well known in the art, and thus its description is not provided herein.

The phantom drive control signal generating unit 366 of the pattern sensing unit 360 determines the logic levels of the phantom drive control signals PHANTOM_SENS<0>, PHANTOM_SENS<1>, PHANTOM_SENS<2> and PHANTOM_SENS<3> according to the binary code SUBBIT<0:2> outputted from the binary operating unit 364, in the following method.

First, in the configuration of the pull-down phantom driving unit 380 described above, the intensity of the phantom source current PTI_SOURCE increases with an increase in the number of the signals with a logic low level among the phantom drive control signals PHANTOM_SENS<0>, PHANTOM_SENS<1>, PHANTOM_SENS<2> and PHANTOM_SENS<3> and decreases with an increase in the number of the signals with a logic high level among the phantom drive control signals PHANTOM_SENS<0>, PHANTOM_SENS<1>, PHANTOM_SENS<2> and PHANTOM_SENS<3>.

Also, the number of the bits with a value of '1' among the data code DATA<0:3> increases with an increase in the value of the binary code SUBBIT<0:2> outputted from the binary operating unit 364 and decreases with a decrease in the value of the binary code SUBBIT<0:2> outputted from the binary operating unit 364. Therefore, the intensity of the phantom source current PTI_SOURCE may decrease with an increase in the value of the binary code SUBBIT<0:2> outputted from the binary operating unit 364 and may increase with a decrease in the value of the binary code SUBBIT<0:2> outputted from the binary operating unit 364.

For example, if the binary code SUBBIT<0:2> outputted from the binary operating unit 364 has a maximum value of '100', because the intensity of the phantom source current PTI_SOURCE must have a minimum value, all of the phantom drive control signals PHANTOM_SENS<0>, PHANTOM_SENS<1>, PHANTOM_SENS<2> and PHANTOM_SENS<3> will have a logic high level.

If the binary code SUBBIT<0:2> outputted from the binary operating unit 364 has a value of '011', the phantom drive control signals PHANTOM_SENS<1>, PHANTOM_SENS<2> and PHANTOM_SENS<3> will have a logic high level and the phantom control signal PHANTOM_SENS<0> will have a logic low level.

If the binary code SUBBIT<0:2> outputted from the binary operating unit 364 has a value of '010', the phantom drive control signals PHANTOM_SENS<2> and PHANTOM_SENS<3> will have a logic high level and the phantom control signals PHANTOM_SENS<0> and PHANTOM_SENS<1> will have a logic low level.

If the binary code SUBBIT<0:2> outputted from the binary operating unit 364 has a value of '001', the phantom drive control signal PHANTOM_SENS<3> will have a logic high level and the phantom control signals PHANTOM_SENS<0>, PHANTOM_SENS<1> and PHANTOM_SENS<2> will have a logic low level.

If the binary code SUBBIT<0:2> outputted from the binary operating unit 364 has a maximum value of '000', all of the phantom drive control signals PHANTOM_SENS<0>, PHANTOM_SENS<1>, PHANTOM_SENS<2> and PHANTOM_SENS<3> will have a logic low level.

The pull-up phantom drivers 380A, 380B, 380C and 380D of the pull-down phantom driving unit 380 drive the reference phantom node REF_PTD by the phantom source current PTI_SOURCE that is sourced through the pull-up phantom node PU_PTD.

Herein, each of the pull-up phantom drivers 380A, 380B, 380C and 380D has a predetermined driving force. Therefore, the driving force for the reference phantom node REF_PTD increases with an increase in the number of the enabled drivers among the pull-up phantom drivers 380A, 380B, 380C and 380D. That is, the intensity of the phantom source current PTI_SOURCE increases with an increase in the number of the enabled drivers among the pull-up phantom drivers 380A, 380B, 380C and 380D.

On the contrary, the driving force for the reference phantom node REF_PTD decreases with a decrease in the number of the enabled drivers among the pull-up phantom drivers 380A, 380B, 380C and 380D. That is, the intensity of the phantom source current PTI_SOURCE decreases with a decrease in the number of the enabled drivers among the pull-up phantom drivers 380A, 380B, 380C and 380D.

The pull-up phantom node PU_PTD, the phantom source current PTI_SOURCE of which is sourced by the pull-up phantom driving unit 380, is connected in parallel to the data output pads DQ0, DQ1, DQ2 and DQ3 with respect to the power supply voltage terminal VDDQ. Therefore, the phantom source current PTI_SOURCE is supplied from the power supply voltage terminal VDDQ after being combined with the pull-up source currents PUI_SOURCE_0, PUI_SOURCE_1, PUI_SOURCE_2 and PUI_SOURCE_3 flowing from the power supply voltage terminal VDDQ to the data output pads DQ0, DQ1, DQ2 and DQ3. That is, with respect to the power supply voltage terminal VDDQ, the pull-up source currents PUI_SOURCE_0, PUI_SOURCE_1, PUI_SOURCE_2 and PUI_SOURCE_3 are not discriminated from the phantom source current PTI_SOURCE.

Consequently, the operation of the data output circuit in accordance with the second embodiment of the present invention is summarized as follows.

First, the pre-drive units 300A, 300B, 300C and 300D, the pull-up driving units 320A, 320B, 320C and 320D, and the pull-down driving units 340A, 340B, 340C and 340D operate in the same way as those of the conventional data output circuit. That is, the intensity of the pull-up source currents PUI_SOURCE_0, PUI_SOURCE_1, PUI_SOURCE_2 and PUI_SOURCE_3 supplied from the power supply voltage terminal VDDQ increases with an increase in the number of the bits with a value of '1' among the bits of the data code DATA<0:3>. The intensity of the pull-up source currents PUI_SOURCE_0, PUI_SOURCE_1, PUI_SOURCE_2 and PUI_SOURCE_3 supplied from the power supply voltage terminal VDDQ decreases with a decrease in the number of the bits with a value of '1' among the bits of the data code DATA<0:3>.

In this way, even when the intensity of the pull-down sink currents pull-up source currents PUI_SOURCE_0, PUI_SOURCE_1, PUI_SOURCE_2 and PUI_SOURCE_3 supplied through the power supply voltage terminal VDDQ from the pull-up driving units 320A, 320B, 320C and 320D and the pull-down driving units 340A, 340B, 340C and 340D changes according to the values of the bits of the data code DATA<0:3>, the total current supplied from the power supply voltage terminal VDDQ in the data output circuit of the second embodiment of the present invention may maintain the same intensity. The reason for this is that the intensity of the pull-up phantom current PUI_SOURCE flowing from the power supply voltage terminal VDDQ to the ground voltage terminal VSSQ by the pull-up phantom driving unit 380 changes according to the values of the bits of the data code DATA<0:3>.

That is, the pull-up phantom driving unit 380 decreases the intensity of the pull-down phantom current PTI_SINK with an increase in the number of the bits with a value of '1' among the bits of the data code DATA<0:3> and increases the intensity of the pull-down phantom current PTI_SINK with a decrease in the number of the bits with a value of '1' among the bits of the data code DATA<0:3>, so that the sum of the intensity of the pull-down phantom current and the intensity of the pull-down sink currents PDI_SINK_0, PDI_SINK_1, PDI_SINK_2 and PDI_SINK_3 may have the same value.

Thus, regardless of whether all the values of the bits of the data code DATA<0:3> switch from '1' to '0' or from '0' to '1', the data output circuit of the second embodiment of the present invention may maintain the constant intensity of the current supplied from the power supply voltage terminal VDDQ, thus making it possible to effectively suppress a simultaneous switching output (SSO) noise generation.

Embodiment 3

Figure 4A:
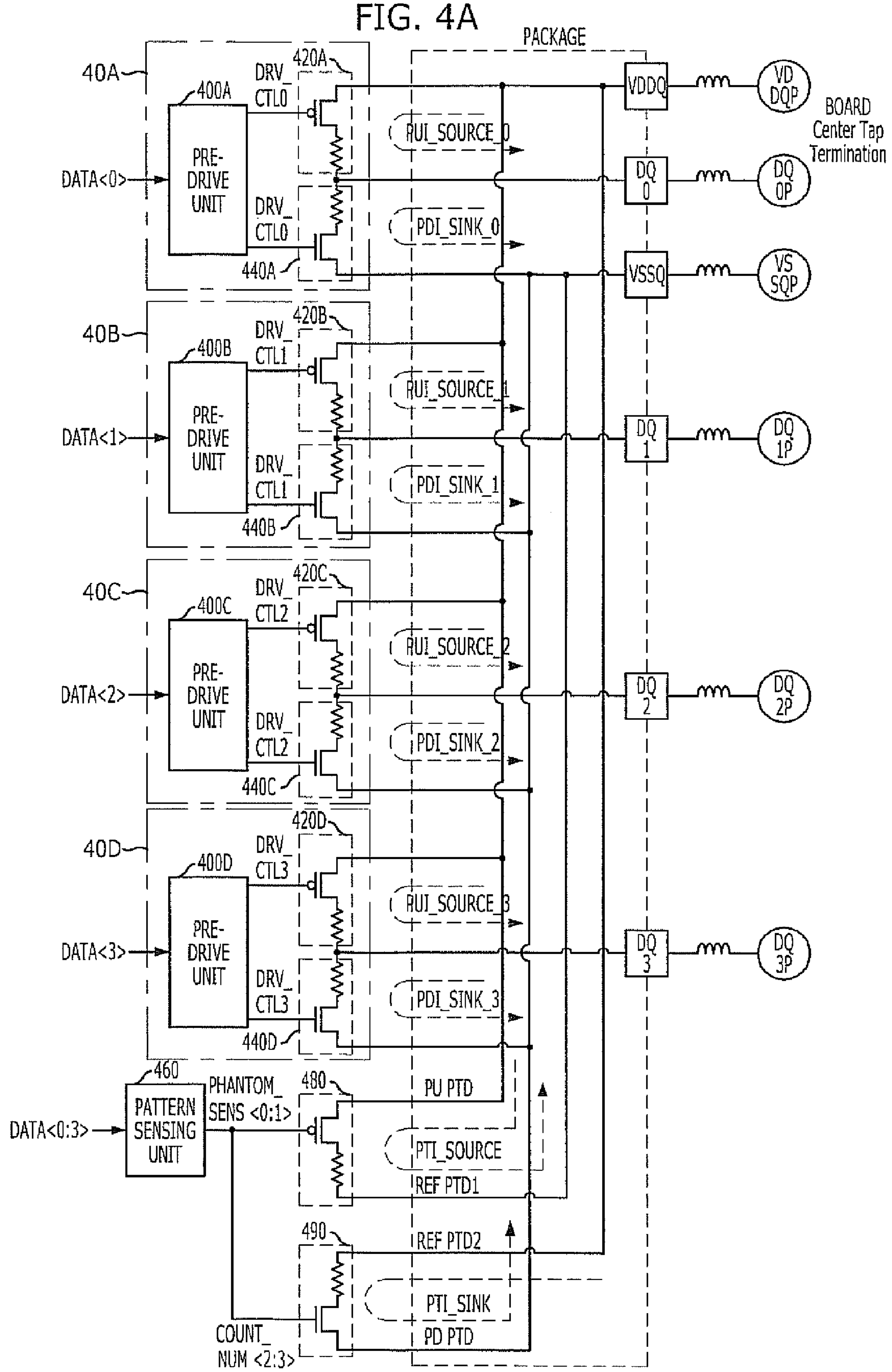
FIG. 4A is a circuit diagram of a data output circuit of a semiconductor device in accordance with a third embodiment of the present invention.

FIG. 4A is a circuit diagram of a data output circuit of a semiconductor device in accordance with a third embodiment of the present invention.

Referring to FIG. 4A, a data output circuit of a semiconductor device in accordance with a third embodiment of the present invention includes a plurality of data driving units 40A, 40B, 40C and 40D, a pattern sensing unit 460, a pull-up phantom driving unit 480, and a pull-down phantom driving unit 490. The data driving units 40A, 40B, 40C and 40D drive a plurality of data output pads DQ0, DQ1, DQ2 and DQ3 in response to a plurality of bits DATA<0>, DATA<1>, DATA<2> and DATA<3> of a data code DATA<0:3>, respectively. The pattern sensing unit 460 senses a specific pattern of the data code DATA<0:3>. The pull-up phantom driving unit 480 pull-up drives a first reference phantom node REF_PTD1 by a phantom source current PTI_SOURCE that is sourced through a pull-up phantom node PU_PTD and changes its intensity in response to an output signal PHANTOM_SENS<0:1> of the pattern sensing unit 460. Herein, the pull-up phantom node PU_PTD is connected in parallel to a power supply voltage terminal VDDQ and the data driving units 40A, 40B, 40C and 40D through a power supply voltage input pin VDDQP, and the first reference phantom node REF_PTD1 is connected to a ground voltage terminal VSSQ through a ground voltage input pin VSSQP. The pull-down phantom driving unit 490 pull-down drives a second reference phantom node REF_PTD2 by a phantom sink current PTI_SINK that sinks through a pull-down phantom node PD_PTD and changes in intensity in response to an output signal PHANTOM_SENS<2:3> of the pattern sensing unit 460. Herein, the pull-down phantom node PD_PTD is connected in parallel to the ground voltage terminal VSSQ and the data driving units 40A, 40B, 40C and 40D through the ground voltage input pin VSSQP, and the second reference phantom node REF_PTD2 is connected to the power supply voltage terminal VDDQ through the power supply voltage input pin VDDQP.

The data driving units 40A, 40B, 40C and 40D include a plurality of pre-drive units 400A, 400B, 400C and 400D, a plurality of pull-up main driving units 420A, 420B, 420C and 420D, and a plurality of pull-down main driving units 440A, 440B, 440C and 440D. The pre-drive units 400A, 400B, 400C and 400D generate a plurality of drive control signals DRV_CTL0, DRV_CTL1, DRV_CTL2 and DRV_CTL3 in response to the bits DATA<0>, DATA<1>, DATA<2> and DATA<3> of the data code DATA<0:3>, respectively. The pull-up main driving units 420A, 420B, 420C and 420D pull-up drive the data output pads DQ1, DQ1, DQ2 and DQ3 by pull-up source currents PUI_SOURCE_0, PUI_SOURCE_1, PUI_SOURCE_2 and PUI_SOURCE_3 of predetermined intensities supplied through the power supply voltage terminal VDDQ in response to the drive control signals DRV_CTL0, DRV_CTL1, DRV_CTL2 and DRV_CTL3, respectively. The pull-down main driving units 440A, 440B, 440C and 440D pull-down drive the data output pads DQ0, DQ1, DQ2 and DQ3 by pull-down sink currents PDL_SINK_0, PDL_SINK_1, PDL_SINK_2 and PDL_SINK_3 of predetermined intensities sinking through the ground voltage terminal VSSQ in response to the drive control signals DRV_CTL0, DRV_CTL1, DRV_CTL2 and DRV_CTL3, respectively.

Figure 4B:
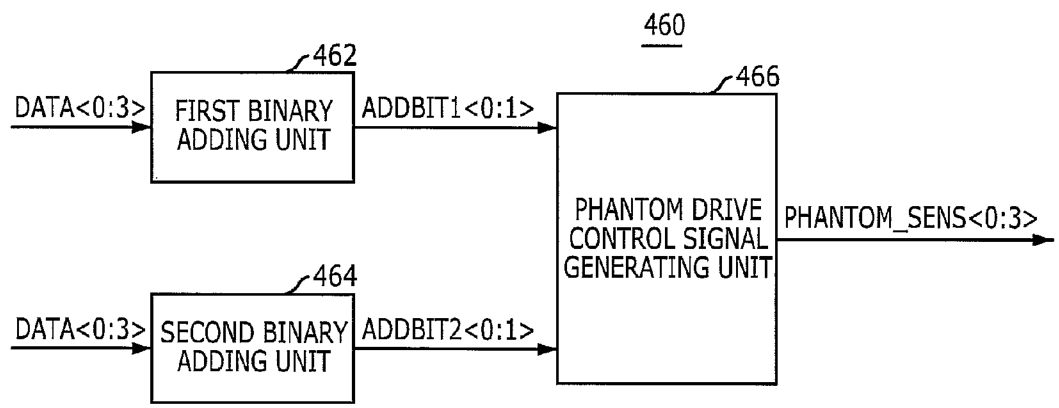
FIG. 4B is a block diagram of a pattern sensing unit of the data output circuit in accordance with the third embodiment of the present invention illustrated in FIG. 4A.

FIG. 4B is a block diagram of the pattern sensing unit 460 of the data output circuit in accordance with the third embodiment of the present invention illustrated in FIG. 4A.

Referring to FIG. 4B, the pattern sensing unit 460 of the data output circuit in accordance with the third embodiment of the present invention includes a first binary adding unit 462, a second binary adding unit 464, and a phantom drive control signal generating unit 466. The first binary adding unit 462 is configured to increase a binary code value ADDBIT1<0:1> outputted according to the number of the bits with a value of '0' among the bits DATA<0>, DATA<1>, DATA<2> and DATA<3> of the data code DATA<0:3>. The second binary adding unit 464 is configured to increase a binary code value ADDBIT2<0:1> outputted according to the number of the bits with a value of '1' among the bits DATA<0>, DATA<1>, DATA<2> and DATA<3> of the data code DATA<0:3>. The phantom drive control signal generating unit 466 compares the binary code ADDBIT1 outputted from the first binary adding unit 462 and the binary code ADDBIT2 outputted from the second binary adding unit 464 to generate a plurality of phantom drive control signals PHANTOM_SENS<0:3> whose logic levels are determined according to the comparison results.

Figure 4C:
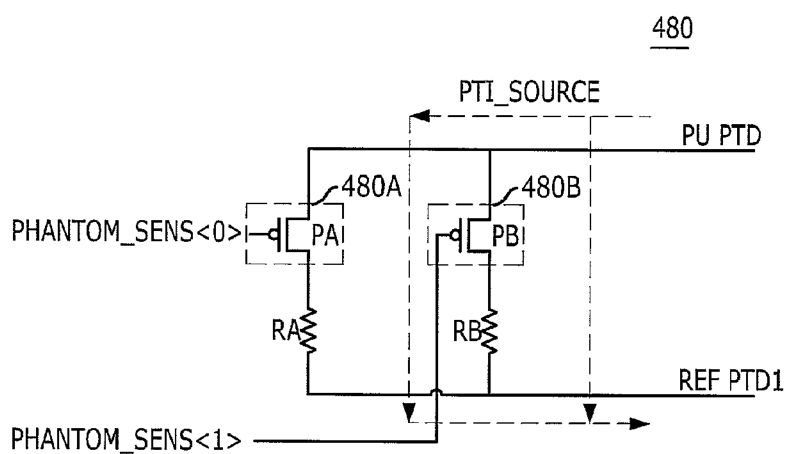
FIG. 4C is a circuit diagram of a pull-up phantom driving unit of the data output circuit in accordance with the third embodiment of the present invention illustrated in FIG. 4A.

FIG. 4C is a circuit diagram of the pull-up phantom driving unit 480 of the data output circuit in accordance with the third embodiment of the present invention illustrated in FIG. 4A.

Referring to FIG. 4C, the pull-up phantom driving unit 480 of the data output circuit in accordance with the third embodiment of the present invention includes a plurality of pull-up phantom drivers 480A and 480B. The pull-up phantom drivers 480A and 480B are disposed between the pull-up phantom node PU_PTD and the reference phantom node REF_PTD. In response to the phantom drive control signals PHANTOM_SENS<0:1> outputted from the pattern sensing unit 460, the pull-up phantom drivers 480A and 480B are selectively enabled to change the intensity of the phantom sink current PTI_SINK.

The pull-up phantom driver 480A includes a PMOS transistor PA that is configured to control the flow of the phantom source current PTI_SOURCE from the source-connected pull-up phantom node PU_PTD to the drain-connected reference phantom node REF_PTD in response to the phantom drive control signal PHANTOM_SENS<0> applied to the gate. The pull-up phantom driver 480B includes a PMOS transistor PB that is configured to control the flow of the phantom source current PTI_SOURCE from the source-connected pull-up phantom node PU_PTD to the drain-connected reference phantom node REF_PTD in response to the phantom drive control signal PHANTOM_SENS<1> applied to the gate.

Figure 4D:
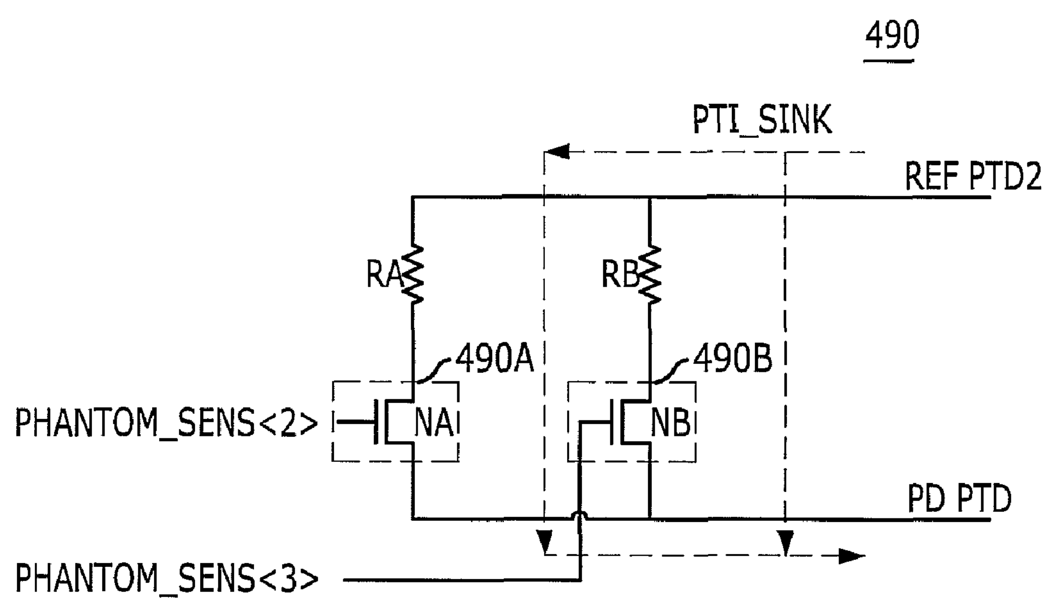
FIG. 4D is a circuit diagram of a pull-down phantom driving unit of the data output circuit in accordance with the third embodiment of the present invention illustrated in FIG. 4A.

FIG. 4D is a circuit diagram of the pull-down phantom driving unit 490 of the data output circuit in accordance with the third embodiment of the present invention illustrated in FIG. 4A.

Referring to FIG. 4D, the pull-down phantom driving unit 490 of the data output circuit in accordance with the third embodiment of the present invention includes a plurality of pull-down phantom drivers 490A and 490B. The pull-down phantom drivers 490A and 490B are disposed between the pull-down phantom node PD_PTD and the reference phantom node REF_PTD. In response to the phantom drive control signals PHANTOM_SENS<2:3> outputted from the pattern sensing unit 460, the pull-down phantom drivers 490A and 490B are selectively enabled to change the intensity of the phantom sink current PTI_SINK.

The pull-down phantom driver 490A includes an NMOS transistor NA that is configured to control the flow of the phantom sink current PTI_SINK from the drain-connected reference phantom node REF_PTD to the source-connected pull-down phantom node PD_PTD in response to the phantom drive control signal PHANTOM_SENS<2> applied to the gate. The pull-down phantom driver 490B includes an NMOS transistor NB that is configured to control the on/off of the flow of the phantom sink current PTI_SINK from the drain-connected reference phantom node REF_PTD to the source-connected pull-down phantom node PD_PTD in response to the phantom drive control signal PHANTOM_SENS<3> applied to the gate.

Based on the above configuration, an operation of the data output circuit in accordance with the third embodiment of the present invention is described hereinafter.

As illustrated in FIG. 4A, because the data output pads DQ0, DQ1, DQ2, and DQ3 are terminated to the power supply voltage terminal VDDQ or the ground voltage terminal VSSQ, the data output circuit maintains the intermediate voltage level between a power supply voltage (VDD) level and a ground voltage (VSS) level while data are not outputted, which is generally called a center tap termination state.

When the inputted data code DATA<0>/DATA<1>/DATA<2>/DATA<3> has a value of '0', the pre-drive unit 400A/400B/400C/400D outputs the drive control signal DRV_CTL0/DRV_CTL1/DRV_CTL2/DRV_CTL3 with the power supply voltage (VDD) level.

When the drive control signal DRV_CTL0/DRV_CTL1/DRV_CTL2/DRV_CTL3 has the power supply voltage (VDD) level, the pull-up main driving unit 420A/420B/420C/420D forms an open circuit between the power supply voltage terminal VDDQ and the data output pad DQ0/DQ1/DQ2/DQ3, so that the pull-up source current PUI_SOURCE_0/PUI_SOURCE_1/PUI_SOURCE_2/PUI_SOURCE_3 does not flow from the power supply voltage terminal VDDQ to the data output pad DQ0/DQ1/DQ2/DQ3. Also, the pull-down main driving unit 440A/440B/440C/440D forms a short circuit between the ground voltage terminal VSSQ and the data output pad DQ0/DQ1/DQ2/DQ3, so that the pull-down sink current PDI_SINK_0/PDI_SINK_1/PDI_SINK_2/PDI_SINK_3 flows to the ground voltage terminal VSSQ from the data output pad DQ0/DQ1/DQ2/DQ3.

That is, when the data code DATA<0>/DATA<1>/DATA<2>/DATA<3> has a value of '0' and thus the drive control signal DRV_CTL0/DRV_CTL1/DRV_CTL2/DRV_CTL3 has the power supply voltage (VDD) level, the power supply voltage terminal VDDQ is disconnected from the data output pad DQ0/DQ1/DQ2/DQ3, so that the pull-up source current PUI_SOURCE_0/PUI_SOURCE_1/PUI_SOURCE_2/PUI_SOURCE_3 does not flow. Also, the pull-down sink current PDI_SINK_0/PDI_SINK_1/PDI_SINK_2/PDI_SINK_3 flows to the ground voltage terminal VSSQ from the data output pad DQ0/DQ1/DQ2/DQ3. Therefore, that the data output pad DQ0/DQ1/DQ2/DQ3 has the same voltage level as the ground voltage (VSS) level of the ground voltage terminal VSSQ. Thus, the data output pad DQ0/DQ1/DQ2/DQ3 has a logic low level.

When the inputted data code DATA<0>/DATA<1>/DATA<2>/DATA<3> has a value of '1', the pre-drive unit 400A/400B/400C/400D outputs the drive control signal DRV_CTL0/DRV_CTL1/DRV_CTL2/DRV_CTL3 with the ground voltage (VSS) level.

When the drive control signal DRV_CTL0/DRV_CTL1/DRV_CTL2/DRV_CTL3 has the ground voltage (VSS) level, the pull-up main driving unit 420A/420B/420C/420D forms a short circuit between the ground voltage terminal VSSQ and the data output pad DQ0/DQ1/DQ2/DQ3, so that the pull-up source current PUI_SOURCE_0/PUI_SOURCE_1/PUI_SOURCE_2/PUI_SOURCE_3 flows from the power supply voltage terminal VDDQ to the data output pad DQ0/DQ1/DQ2/DQ3. Also, the pull-down main driving unit 440A/440B/440C/440D forms an open circuit between the ground voltage terminal VSSQ and the data output pad DQ0/DQ1/DQ2/DQ3, so that the pull-down sink current PDI_SINK_0/

PDI_SINK_1/PDI_SINK_2/PDI_SINK_3 flows to the ground voltage terminal VSSQ from the data output pad DQ0/DQ1/DQ2/DQ3.

That is, when the data code DATA<0>/DATA<1>/DATA<2>/DATA<3> has a value of '1' and thus the drive control signal DRV_CTL0/DRV_CTL1/DRV_CTL2/DRV_CTL3 has the ground voltage (VSS) level, the power supply voltage terminal VDDQ is connected to the data output pad DQ0/DQ1/DQ2/DQ3, so that the pull-up source current PUI_SOURCE_0/PUI_SOURCE_1/PUI_SOURCE_2/PUI_SOURCE_3 flows therethrough. Also, the ground voltage terminal VSSQ is disconnected from the data output pad DQ0/DQ1/DQ2/DQ3, so that the pull-down sink current PDI_SINK_0/PDI_SINK_1/PDI_SINK_2/PDI_SINK_3 does not flow. Therefore, that the data output pad DQ0/DQ1/DQ2/DQ3 has the same voltage level as the power supply voltage (VDD) level of the power supply voltage terminal VDDQ. Thus, the data output pad DQ0/DQ1/DQ2/DQ3 has a logic high level.

The first binary adding unit 462 of the pattern sensing unit 460 determines the binary code value ADDBIT1<0:2> outputted according to the number of the bits with a value of '0' among the bits DATA<0>, DATA<1>, DATA<2> and DATA<3> of the data code DATA<0:3>, and the second binary adding unit 464 of the pattern sensing unit 460 determines the binary code value ADDBIT2<0:2> outputted according to the number of the bits with a value of '1' among the bits DATA<0>, DATA<1>, DATA<2> and DATA<3> of the data code DATA<0:3>, in the following method.

First, the binary code ADDBIT1<0:2> and the binary code ADDBIT2<0:2> outputted respectively from the first binary adding unit 462 and the second binary adding unit 464 have an initial value of '000'. In this state, the bits DATA<0>, DATA<1>, DATA<2> and DATA<3> of the data code DATA<0:3> are detected sequentially one by one. If the detect bit value is '0', the value of the binary code ADDBIT1<0:2> outputted from the first binary adding unit 462 is increased and the value of the binary code ADDBIT2<0:2> outputted from the second binary adding unit 464 is not increased. If the detect bit value is '1', the value of the binary code ADDBIT1<0:2> outputted from the first binary adding unit 462 is not increased and the value of the binary code ADDBIT2<0:2> outputted from the second binary adding unit 464 is increased.

In this way, when the bits DATA<0>, DATA<1>, DATA<2> and DATA<3> of the data code DATA<0:3> are all detected, the values of the final binary code ADDBIT1<0:2> and the final binary code ADDBIT2<0:2> outputted respectively from the first binary adding unit 462 and the second binary adding unit 464 are determined.

For example, if there is no bit with a value of '1' among the bits DATA<0>, DATA<1>, DATA<2> and DATA<3> of the data code DATA<0:3>, the binary code ADDBIT1<0:2> outputted from the first binary adding unit 462 will have a maximum value of '100' and the binary code ADDBIT2<0:2> outputted from the second binary adding unit 464 will maintain an initial value of '000'.

If there are one bit with a value of '0' and three bits with a value of '1' among the bits DATA<0>, DATA<1>, DATA<2> and DATA<3> of the data code DATA<0:3>, the binary code ADDBIT1<0:2> outputted from the first binary adding unit 462 will have a value of '001' and the binary code ADDBIT2<0:2> outputted from the second binary adding unit 464 will have a value of '011'.

If there are two bits with a value of '0' and two bits with a value of '1' among the bits DATA<0>, DATA<1>, DATA<2> and DATA<3> of the data code DATA<0:3>, the binary code ADDBIT1<0:2> outputted from the first binary adding unit 462 will have a value of '010' and the binary code ADDBIT2<0:2> outputted from the second binary adding unit 464 will have a value of '010'.

If there are three bits with a value of '0' and one bit with a value of '1' among the bits DATA<0>, DATA<1>, DATA<2> and DATA<3> of the data code DATA<0:3>, the binary code ADDBIT1<0:2> outputted from the first binary adding unit 462 will have a value of '011' and the binary code ADDBIT2<0:2> outputted from the second binary adding unit 464 will have a value of '001'.

If there is no bit with a value of '0' among the bits DATA<0>, DATA<1>, DATA<2> and DATA<3> of the data code DATA<0:3>, the binary code ADDBIT1<0:2> outputted from the first binary adding unit 462 will maintain an initial value of '000' and the binary code ADDBIT2<0:2> outputted from the second binary adding unit 464 will have a maximum value of '100'.

As described above, the value of the binary code ADDBIT<0:2> may be determined by detecting the bits DATA<0>, DATA<1>, DATA<2> and DATA<3> of the data code DATA<0:3> sequentially one by one. Also, all of the bits DATA<0>, DATA<1>, DATA<2> and DATA<3> of the data code DATA<0:3> may be simultaneously detected, and the values of the binary codes ADDBIT<0:2> may be simultaneously increased according to the detection results.

The phantom drive control signal generating unit 466 of the pattern sensing unit 460 compares the binary code ADDBIT1<0:2> outputted from the first binary adding unit 462 with the binary code ADDBIT2<0:2> outputted from the second binary adding unit 464 and determines the logic levels of the phantom drive control signals PHANTOM_SENS<0>, PHANTOM_SENS<1>, PHANTOM_SENS<2> and PHANTOM_SENS<3> according to the comparison results, in the following method.

The operation of comparing the binary code ADDBIT1<0:2> outputted from the first binary adding unit 462 with the binary code ADDBIT2<0:2> outputted from the second binary adding unit 464 may have the following three cases.

The first case is that the value of the binary code ADDBIT1<0:2> outputted from the first binary adding unit 462 is greater than the value of the binary code ADDBIT2<0:2> outputted from the second binary adding unit 464. In this case, the number of the bits with a value of '0' among the bits of the data code DATA<0:3> is larger than the number of the bits with a value of '1' among the bits of the data code DATA<0:3>. Thus, the intensity of the pull-up source currents PUI_SOURCE_0, PUI_SOURCE_1, PUI_SOURCE_2 and PUI_SOURCE_3 flowing from the power supply voltage terminal VDDQ to the data output terminals DQ0, DQ1, DQ2 and DQ3 by the pull-up driving units 220A, 220B, 220C and 220D is smaller than the intensity of the pull-down sink currents PDI_SINK_0, PDI_SINK_1, PDI_SINK_2 and PDI_SINK_3 flowing from the data output terminals DQ0, DQ1, DQ2 and DQ3 to the ground voltage terminal VSSQ by the pull-down driving units 240A, 240B, 240C and 240D. Therefore, the phantom source current PTI_SOURCE supplied in parallel to the pull-up source currents PUI_SOURCE_0, PUI_SOURCE_1, PUI_SOURCE_2 and PUI_SOURCE_3 with respect to the power supply voltage terminal VDDQ is controlled to flow to the ground voltage terminal VSSQ.

To this end, among the phantom drive control signals PHANTOM_SENS<0>, PHANTOM_SENS<1>, PHANTOM_SENS<2> and PHANTOM_SENS<3>, both or one of the first and second phantom drive control signals PHAN- TOM_SENS<0> and PHANTOM_SENS<1> may be set to a logic low level to suitably control the intensity of the phantom source current PTI_SOURCE, and both of the third and fourth phantom drive control signals PHANTOM_SENS<2> and PHANTOM_SENS<3> are fixed to a logic low level to cease a flow of the phantom sink current PTI_SINK.

The second case is that the value of the binary code ADDBIT1<0:2> outputted from the first binary adding unit 462 is smaller than the value of the binary code ADDBIT2<0:2> outputted from the second binary adding unit 464. In this case, the number of the bits with a value of '0' among the bits of the data code DATA<0:3> is smaller than the number of the bits with a value of '1' among the bits of the data code DATA<0:3>. Thus, the intensity of the pull-up source currents PUI_SOURCE_0, PUI_SOURCE_1, PUI_SOURCE_2 and PUI_SOURCE_3 flowing from the power supply voltage terminal VDDQ to the data output terminals DQ0, DQ1, DQ2 and DQ3 by the pull-up driving units 220A, 220B, 220C and 220D is greater than the intensity of the pull-down sink currents PDI_SINK_0, PDI_SINK_1, PDI_SINK_2 and PDI_SINK_3 flowing from the data output terminals DQ0, DQ1, DQ2 and DQ3 to the ground voltage terminal VSSQ by the pull-down driving units 240A, 240B, 240C and 240D. Therefore, the phantom sink current PTI_SINK supplied in parallel to the pull-down sink currents PDI_SINK_0, PDI_SINK_1, PDI_SINK_2 and PDI_SINK_3 with respect to the ground voltage terminal VSSQ is supplied from the power supply voltage terminal VDDQ.

To this end, among the phantom drive control signals PHANTOM_SENS<0>, PHANTOM_SENS<1>, PHANTOM_SENS<2> and PHANTOM_SENS<3>, both or one of the third and fourth phantom drive control signals PHANTOM_SENS<2> and PHANTOM_SENS<3> may be set to a logic high level to suitably control the intensity of the phantom sink current PTI_SINK, and both of the first and second phantom drive control signals PHANTOM_SENS<0> and PHANTOM_SENS<1> are fixed to a logic high level to cease the flow of the phantom source current PTI_SOURCE.

The third case is that the value of the binary code ADDBIT1<0:2> outputted from the first binary adding unit 462 is equal to the value of the binary code ADDBIT2<0:2> outputted from the second binary adding unit 464. In this case, the number of the bits with a value of '0' among the bits of the data code DATA<0:3> is equal to the number of the bits with a value of '1' among the bits of the data code DATA<0:3>. Thus, the intensity of the pull-up source currents PUI_SOURCE_0, PUI_SOURCE_1, PUI_SOURCE_2 and PUI_SOURCE_3 flowing from the power supply voltage terminal VDDQ to the data output terminals DQ0, DQ1, DQ2 and DQ3 by the pull-up driving units 220A, 220B, 220C and 220D is equal to the intensity of the pull-down sink currents PDI_SINK_0, PDI_SINK_1, PDI_SINK_2 and PDI_SINK_3 flowing from the data output terminals DQ0, DQ1, DQ2 and DQ3 to the ground voltage terminal VSSQ by the pull-down driving units 240A, 240B, 240C and 240D. Therefore, both of the phantom source current PTI_SOURCE and the phantom sink current PTI_SINK may not be provided.

To this end, among the phantom drive control signals PHANTOM_SENS<0>, PHANTOM_SENS<1>, PHANTOM_SENS<2> and PHANTOM_SENS<3>, both or one of the first and second phantom drive control signals PHANTOM_SENS<0> and PHANTOM_SENS<1> may be fixed to a logic high level to cease the flow of the phantom source current PTI_SOURCE, and both of the third and fourth phantom drive control signals PHANTOM_SENS<2> and PHANTOM_SENS<3> may be fixed to a logic low level to cease the flow of the phantom sink current PTI_SINK.

The pull-up phantom drivers 480A and 480B of the pull-up phantom driving unit 480 drive the reference phantom node REF_PTD by the phantom source current PTI_SOURCE that is provided to their sources through the pull-up phantom node PU_PTD.

Herein, each of the pull-up phantom drivers 480A and 480B has a predetermined driving force. Therefore, the driving force for the reference phantom node REF_PTD1 increases with an increase in the number of the enabled drivers among the pull-up phantom drivers 480A and 480B. That is, the intensity of the phantom source current PTI_SOURCE increases with an increase in the number of the enabled drivers among the pull-up phantom drivers 480A and 480B.

On the contrary, the driving force for the reference phantom node REF_PTD1 decreases with a decrease in the number of the enabled drivers among the pull-up phantom drivers 480A and 480B. That is, the intensity of the phantom source current PTI_SOURCE decreases with a decrease in the number of the enabled drivers among the pull-up phantom drivers 480A and 480B.

The pull-up phantom node PU_PTD is connected in parallel to the data output pads DQ0, DQ1, DQ2 and DQ3 with respect to the power supply voltage terminal VDDQ. Therefore, the phantom source current PTI_SOURCE is supplied from the power supply voltage terminal VDDQ after being combined with the pull-up source currents PUI_SOURCE_0, PUI_SOURCE_1, PUI_SOURCE_2 and PUI_SOURCE_3 flowing from the power supply voltage terminal VDDQ to the data output pads DQ0, DQ1, DQ2 and DQ3. That is, with respect to the power supply voltage terminal VDDQ, the pull-up source currents PUI_SOURCE_0, PUI_SOURCE_1, PUI_SOURCE_2 and PUI_SOURCE_3 are not discriminated from the phantom source current PTI_SOURCE.

The pull-down phantom drivers 490A and 490B of the pull-down phantom driving unit 490 drive the reference phantom node REF_PTD by the phantom sink current PTI_SINK that sinks through the pull-down phantom node PD_PTD.

Herein, each of the pull-down phantom drivers 490A and 490B has a predetermined driving force. Therefore, the driving force for the reference phantom node REF_PTD increases with an increase in the number of the enabled drivers among the pull-down phantom drivers 490A and 490B. That is, the intensity of the phantom sink current PTI_SINK increases with an increase in the number of the enabled drivers among the pull-down phantom drivers 490A and 490B.

On the contrary, the driving force for the reference phantom node REF_PTD decreases with a decrease in the number of the enabled drivers among the pull-down phantom drivers 490A and 490B. That is, the intensity of the phantom sink current PTI_SINK decreases with a decrease in the number of the enabled drivers among the pull-down phantom drivers 490A and 490B.

The pull-down phantom node PD_PTD is connected in parallel to the data output pads DQ0, DQ1, DQ2 and DQ3 with respect to the ground voltage terminal VSSQ. Therefore, the phantom sink current PTI_SINK sinks to the ground voltage terminal VSSQ after being combined with the pull-down sink currents PDI_SINK_0, PDI_SINK_1, PDI_SINK_2 and PDI_SINK_3 flowing from the data output pads DQ0, DQ1, DQ2 and DQ3 to the ground voltage terminal VSSQ. That is, with respect to the ground voltage terminal VSSQ, the pull-down sink currents PDI_SINK_0, PDI_SINK_1, PDI_SINK_2 and PDI_SINK_3 are not discriminated from the phantom sink current PTI_SINK.

Consequently, the operation of the data output circuit in accordance with the third embodiment of the present invention is summarized as follows.

First, the pre-drive units 400A, 400B, 400C and 400D operate in the same way as those of the conventional data output circuit.

The intensity of the pull-up source currents PUI_SOURCE_0, PUI_SOURCE_1, PUI_SOURCE_2 and PUI_SOURCE_3 supplied from the power supply voltage terminal VDDQ increases with an increase in the number of the bits with a value of '1' among the bits of the data code DATA<0:3>. The intensity of the pull-up source currents PUI_SOURCE_0, PUI_SOURCE_1, PUI_SOURCE_2 and PUI_SOURCE_3 supplied from the power supply voltage terminal VDDQ decreases with a decrease in the number of the bits with a value of '1' among the bits of the data code DATA<0:3>.

Also, the intensity of the pull-down sink currents PDI_SINK_0, PDI_SINK_1, PDI_SINK_2 and PDI_SINK_3 flowing into the ground voltage terminal VSSQ increases with an increase in the number of the bits with a value of '0' among the bits of the data code DATA<0:3>. The intensity of the pull-down sink currents PDI_SINK_0, PDI_SINK_1, PDI_SINK_2 and PDI_SINK_3 flowing into the ground voltage terminal VSSQ decreases with a decrease in the number of the bits with a value of '0' among the bits of the data code DATA<0:3>.

In this state, the intensity of the pull-up source currents PUI_SOURCE_0, PUI_SOURCE_1, PUI_SOURCE_2 and PUI_SOURCE_3 supplied from the pull-up driving units 420A, 420B, 420C and 420D according to the values of the bits of the data code DATA<0:3> through the power supply voltage terminal VDDQ is compared with the intensity of the pull-down sink currents PDI_SINK_0, PDI_SINK_1, PDI_SINK_2 and PDI_SINK_3 flowing from the pull-down driving units 440A, 440B, 440C and 440D to the ground voltage terminal VSSQ, and the intensity of the phantom source current PTI_SOURCE corresponding to the pull-up source currents PUI_SOURCE_0, PUI_SOURCE_1, PUI_SOURCE_2 and PUI_SOURCE_3 or the intensity of the phantom sink current PTI_SINK corresponding to the pull-down sink currents PDI_SINK_0, PDI_SINK_1, PDI_SINK_2 and PDI_SINK_3 is suitably controlled so that the sum of the intensity of the phantom source current PTI_SOURCE and the intensity of the pull-up source currents PUI_SOURCE_0, PUI_SOURCE_1, PUI_SOURCE_2 and PUI_SOURCE_3 is equal to the sum of the intensity of the phantom sink current PTI_SINK and the intensity of the pull-down sink currents PDI_SINK_0, PDI_SINK_1, PDI_SINK_2 and PDI_SINK_3.

Thus, regardless of whether all the values of the bits of the data code DATA<0:3> switch from '1' to '0' or from '0' to '1', the data output circuit of the third embodiment of the present invention may maintain the constant intensity of the current supplied from the power supply voltage terminal VDDQ, thus making it possible to suppress a simultaneous switching output (SSO) noise in an effective manner.

Embodiment 4

Figure 5:
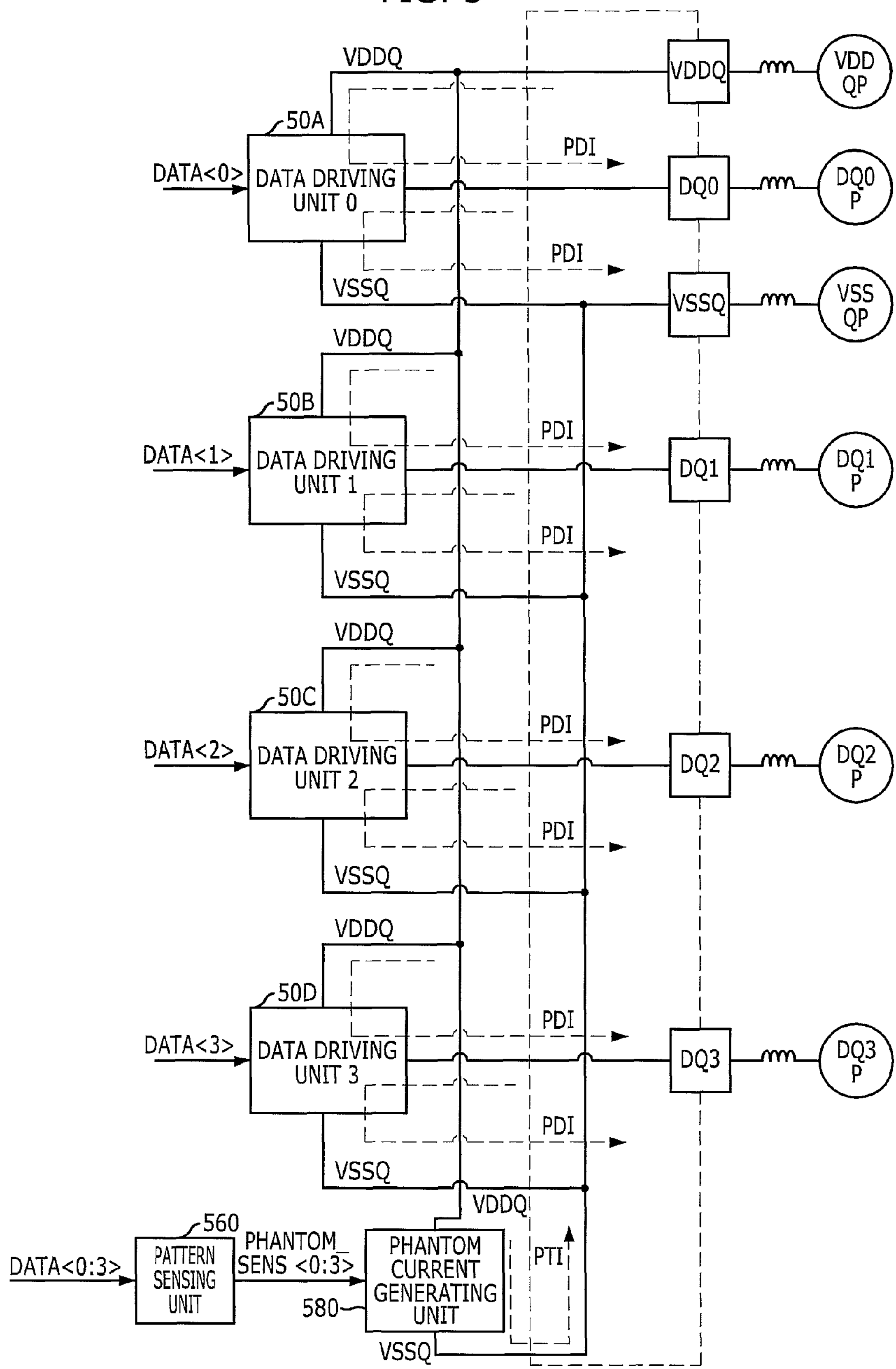
FIG. 5 is a circuit diagram of a data output circuit of a semiconductor device in accordance with a fourth embodiment of the present invention.

FIG. 5 is a circuit diagram of a data output circuit of a semiconductor device in accordance with a fourth embodiment of the present invention.

Referring to FIG. 5A, a data output circuit of a semiconductor device in accordance with a fourth embodiment of the present invention includes a plurality of data driving units 50A, 50B, 50C and 50D, a pattern sensing unit 560, and a phantom current generating unit 580. The data driving units 50A, 50B, 50C and 50D drive a plurality of data output pads DQ0, DQ1, DQ2 and DQ3 by a data current PDI provided through a ground voltage input pin VSSQP, in response to a plurality of bits DATA<0>, DATA<1>, DATA<2> and DATA<3> of a data code DATA<0:3>, respectively. The pattern sensing unit 560 senses a specific pattern of the data code DATA<0:3>. The phantom current generating unit 580 generates a phantom current PTI that flows to the ground voltage input pin VSSQP from a power supply voltage input pin VDDQP and changes in intensity according to an output signal PHANTOM_SENS<0:3> of the pattern sensing unit 560.

According to the bits DATA<0>, DATA<1>, DATA<2> and DATA<3 of the data code DATA<0:3>, the data driving units 50A, 50B, 50C and 50D drive the data current PDI from the power supply voltage input pin VDDQP to the data output pads DQ0, DQ1, DQ2 and DQ3, or sink the data current PDI from the data output pads DQ0, DQ1, DQ2 and DQ3 to the ground voltage input pin VSSQP.

Although not illustrated in FIG. 5, when the data output pads DQ0, DQ1, DQ2 and DQ3 are terminated through the power supply voltage input pin VDDQP to a power supply voltage terminal VDDQ, a power supply voltage (VDD) level is maintained if data are not outputted from the data output pads DQ0, DQ1, DQ2 and DQ3. Thus, according to the bits DATA<0>, DATA<1>, DATA<2> and DATA<3 of the data code DATA<0:3>, the data current PDI sinks from the data output pads DQ0, DQ1, DQ2 and DQ3 to the ground voltage input pin VSSQP.

Although not illustrated in FIG. 5, when the data output pads DQ0, DQ1, DQ2 and DQ3 are terminated through the ground voltage input pin VSSQP to a ground voltage terminal VSSQ, a ground voltage (VSS) level is maintained if data are not outputted from the data output pads DQ0, DQ1, DQ2 and DQ3. Therefore, according to the bits DATA<0>, DATA<1>, DATA<2> and DATA<3 of the data code DATA<0:3>, the data current PDI is driven from the power supply voltage input pin VDDQP to the data output pads DQ0, DQ1, DQ2 and DQ3.

As illustrated in FIG. 5, when the data output pads DQ0, DQ1, DQ2 and DQ3 are not terminated to the power supply voltage terminal VDDQ or the ground voltage terminal VSSQ, the voltage level state may not be known if data are not outputted from the data output pads DQ0, DQ1, DQ2 and DQ3. Therefore, according to the bits DATA<0>, DATA<1>, DATA<2> and DATA<3> of the data code DATA<0:3>, the data current PDI sinks from the data output pads DQ0, DQ1, DQ2 and DQ3 to the ground voltage input pin VSSQP and the data current PDI is driven from the power supply voltage input pin VDDQP to the data output pads DQ0, DQ1, DQ2 and DQ3.

The pattern sensing unit 560 generates a first pattern sensing signal, a second pattern sensing signal, and a third pattern sensing signal (not illustrated in FIG. 5). The value of the first pattern sending signal increases according to the number of the bits with a value of '0' among the bits DATA<0>, DATA<1>, DATA<2> and DATA<3> of the data code DATA<0:3>. The value of the second pattern sensing signal increases according to the number of the bits with a value of '1' among the bits DATA<0>, DATA<1>, DATA<2> and DATA<3> of the data code DATA<0:3>. The value of the third pattern sensing signal increases according to the number of the bits with a value of '0' among the bits DATA<0>, DATA<1>, DATA<2> and DATA<3> of the data code DATA<0:3> and decreases according to the number of the bits with a value of '1' among the bits DATA<0>, DATA<1>, DATA<2> and DATA<3 of the data code DATA<0:3>.

Although not illustrated in FIG. 5, when the data output pads DQ0, DQ1, DQ2 and DQ3 are terminated through the ground voltage input pin VSSQP to the ground voltage terminal VSSQ, the phantom current generating unit 580 provides the phantom current PTI that has a value determined according to the first pattern sensing signal and flows from the power supply voltage input pin VDDQP to the ground voltage input pin VSSQP.

Although not illustrated in FIG. 5, when the data output pads DQ0, DQ1, DQ2 and DQ3 are terminated through the power supply voltage input pin VDDQP to the power supply voltage terminal VDDQ, the phantom current generating unit 580 provides the phantom current PTI that has a value determined according to the second pattern sensing signal and flows from the power supply voltage input pin VDDQP to the ground voltage input pin VSSQP.

As illustrated in FIG. 5, when the data output pads DQ0, DQ1, DQ2 and DQ3 are not terminated to the power supply voltage terminal VDDQ or the ground voltage terminal VSSQ, the phantom current generating unit 580 provides the phantom current PTI that has a value determined according to the third pattern sensing signal and flows from the power supply voltage input pin VDDQP to the ground voltage input pin VSSQP.

Also, as the values of the first to third pattern sensing signals increase, the phantom current generating unit 580 increases the intensity of the phantom current PTI that flows from the power supply voltage input pin VDDQP to the ground voltage input pin VSSQP. As the values of the first to third pattern sensing signals decrease, the phantom current generating unit 580 decreases the intensity of the phantom current PTI that flows from the power supply voltage input pin VDDQP to the ground voltage input pin VSSQP.

Consequently, the operation of the data output circuit in accordance with the fourth embodiment of the present invention is summarized as follows.

Although not illustrated in FIG. 5, when the data output pads DQ0, DQ1, DQ2 and DQ3 are terminated through the ground voltage input pin VSSQP to the ground voltage terminal VSSQ, the intensity of the data current PDI supplied from the power supply voltage input pin VDDQP to the data output pads DQ0, DQ1, DQ2 and DQ3 increases with an increase in the number of the bits with a value of '1' (i.e., a decrease in the number of the bits with a value of '0') among the bits DATA<0>, DATA<1>, DATA<2> and DATA<3> of the data code DATA<0:3> and decreases with a decrease in the number of the bits with a value of '1' (i.e., an increase in the number of the bits with a value of '0') among the bits DATA<0>, DATA<1>, DATA<2> and DATA<3> of the data code DATA<0:3>.

In this case, the phantom current PTI, the intensity of which decreases with an increase in the number of the bits with a value of '1' (i.e., a decrease in the number of the bits with a value of '0') among the bits DATA<0>, DATA<1>, DATA<2> and DATA<3 of the data code DATA<0:3> and increases with a decrease in the number of the bits with a value of '1' (i.e., an increase in the number of the bits with a value of '0') among the bits DATA<0>, DATA<1>, DATA<2> and DATA<3> of the data code DATA<0:3>, is allowed to flow from the power supply voltage input pin VDDQP to the ground voltage input pin VSSQP, thereby making it possible to maintain the total intensity of the data current PDI and the phantom current PTI to be constant regardless of the value of the data code DATA<0:3>.

Although not illustrated in FIG. 5, when the data output pads DQ0, DQ1, DQ2 and DQ3 are terminated through the power supply voltage input pin VDDQP to the power supply voltage terminal VDDQ, the intensity of the data current PDI supplied from the data output pads DQ0, DQ1, DQ2 and DQ3 to the ground voltage input pin VSSQP decreases with an increase in the number of the bits with a value of '1' (i.e., a decrease in the number of the bits with a value of '0') among the bits DATA<0>, DATA<1>, DATA<2> and DATA<3> of the data code DATA<0:3> and increases with a decrease in the number of the bits with a value of '1' (i.e., an increase in the number of the bits with a value of '0') among the bits DATA<0>, DATA<1>, DATA<2> and DATA<3> of the data code DATA<0:3>.

In this case, the phantom current PTI, the intensity of which increases with an increase in the number of the bits with a value of '1' (i.e., a decrease in the number of the bits with a value of '0') among the bits DATA<0>, DATA<1>, DATA<2> and DATA<3> of the data code DATA<0:3> and decreases with a decrease in the number of the bits with a value of '1' (i.e., an increase in the number of the bits with a value of '0') among the bits DATA<0>, DATA<1>, DATA<2> and DATA<3> of the data code DATA<0:3>, is allowed to flow from the power supply voltage input pin VDDQP to the ground voltage input pin VSSQP, thereby making it possible to maintain the total intensity of the data current PDI and the phantom current PTI to be constant regardless of the value of the data code DATA<0:3>.

As illustrated in FIG. 5, when the data output pads DQ0, DQ1, DQ2 and DQ3 are not terminated to the power supply voltage terminal VDDQ or the ground voltage terminal VSSQ, the intensity of the data current PDI supplied from the power supply voltage input pin VDDQP to the data output pads DQ0, DQ1, DQ2 and DQ3 increases with an increase in the number of the bits with a value of '1' (i.e., a decrease in the number of the bits with a value of '0') among the bits DATA<0>, DATA<1>, DATA<2> and DATA<3> of the data code DATA<0:3>, and the intensity of the data current PDI supplied from the data output pads DQ0, DQ1, DQ2 and DQ3 to the ground voltage input pin VSSQP decreases with an increase in the number of the bits with a value of '1' (i.e., a decrease in the number of the bits with a value of '0') among the bits DATA<0>, DATA<1>, DATA<2> and DATA<3> of the data code DATA<0:3>.

Also, the intensity of the data current PDI supplied from the power supply voltage input pin VDDQP to the data output pads DQ0, DQ1, DQ2 and DQ3 decreases with a decrease in the number of the bits with a value of '1' (i.e., an increase in the number of the bits with a value of '0') among the bits DATA<0>, DATA<1>, DATA<2> and DATA<3> of the data code DATA<0:3>, and the intensity of the data current PDI supplied from the data output pads DQ0, DQ1, DQ2 and DQ3 to the ground voltage input pin VSSQP increases with a decrease in the number of the bits with a value of '1' (i.e., an increase in the number of the bits with a value of '0') among the bits DATA<0>, DATA<1>, DATA<2> and DATA<3 of the data code DATA<0:3>.

In this case, the phantom current PTI, the intensity of which increases with an increase in the difference between the number of the bits with a value of '1' and the number of the bits with a value of '0' among the bits DATA<0>, DATA<1>, DATA<2> and DATA<3 of the data code DATA<0:3> and decreases with a decrease in the difference between the number of the bits with a value of '1' and the number of the bits with a value of '0' among the bits DATA<0>, DATA<1>, DATA<2> and DATA<3 of the data code DATA<0:3>, is allowed to flow from the power supply voltage input pin VDDQP to the ground voltage input pin VSSQP, thereby making it possible to maintain the total intensity of the data current PDI and the phantom current PTI to be constant regardless of the value of the data code DATA<0:3>.

Thus, regardless of whether all the values of the bits of the data code DATA<0:3> switch from '1' to '0' or from '0' to '1', the data output circuit of the fourth embodiment of the present invention may maintain the constant intensity of the current supplied from the power supply voltage terminal VDDQ, thus making it possible to suppress a simultaneous switching output (SSO) noise in an effective manner.

In accordance with the embodiments of the present invention as described above, the phantom currents (i.e., the phantom source current PTI_SOURCE and the phantom sink current PTI_SINK), whose intensity varies depending on the bit information of the data code DATA<0:3> to be outputted through the data output circuit of the semiconductor device, are controlled to flow from the power supply voltage terminal VDDQ to the ground voltage terminal VSSQ, thereby making it possible to prevent a large amount of the pull-up source currents PUI_SOURCE_0, PUI_SOURCE_1, PUI_SOURCE_2 and PUI_SOURCE_3 from flowing suddenly into the ground voltage terminal VSSQ and to prevent a large amount of the pull-down sink currents PDI_SINK_0, PDI_SINK_1, PDI_SINK_2 and PDI_SINK_3 from being suddenly supplied from the power supply voltage terminal VDDQ. Thus, it is possible to suppress a simultaneous switching output (SSO) noise in an effective manner.

Thus, before packaging, it is possible to effectively suppress a simultaneous switching output (SSO) noise even when only a minimum number of nodes (i.e., the pull-up phantom node PU_PTD, the pull-down phantom node PD_PTD, and the reference node REF_PTD) are used to flow the phantom currents (i.e., the phantom source current PTI_SOURCE and the phantom sink current PTI_SINK) between the power supply voltage terminal VDDQ and the ground voltage terminal VSSQ.

Also, after packaging, the nodes (i.e., the pull-up phantom node PU_PTD, the pull-down phantom node PD_PTD, and the reference node REF_PTD) for flowing the phantom currents (i.e., the phantom source current PTI_SOURCE and the phantom sink current PTI_SINK) from the power supply voltage terminal VDDQ to the ground voltage terminal VSSQ can be connected to the power supply voltage input pin VDDQP and the ground voltage input pin VSSQP external to the semiconductor device. Therefore, without additional input pins, the phantom currents (i.e., the phantom source current PTI_SOURCE and the phantom sink current PTI_SINK) can be allowed to flow from the power supply voltage terminal VDDQ to the ground voltage terminal VSSQ.

In accordance with the present invention as described above, the phantom currents, whose intensity varies depending on the bit information of the data code to be outputted through the data output circuit of the semiconductor device, are controlled to flow from the power supply voltage terminal VDDQ to the ground voltage terminal VSSQ, thereby making it possible to prevent a large amount of the source currents from flowing suddenly into the ground voltage terminal VSSQ and prevent a large amount of the sink currents from being suddenly supplied from the power supply voltage terminal VDDQ. Thus, it is possible to effectively prevent the occurrence of a simultaneous switching output (SSO) noise.

Thus, even when only a minimum number of pads are used to flow the phantom currents from the power supply voltage terminal VDDQ to the ground voltage terminal VSSQ, a simultaneous switching output (SSO) noise generation can be effectively suppressed, thereby making it possible to provide stable data output.

Also, the pads for flow the phantom currents from the power supply voltage terminal VDDQ to the ground voltage terminal VSSQ can be connected to the power supply voltage input pin VDDQP and the ground voltage input pin VSSQP external to the semiconductor device. Therefore, even without additional input pins for the flow of the phantom currents from the power supply voltage terminal VDDQ to the ground voltage terminal VSSQ, a simultaneous switching output (SSO) noise can be effectively suppressed, thereby making it possible to provide stable data output.

While the present invention has been described with respect to the specific embodiments, it will be apparent to those skilled in the art that various changes and modifications may be made without departing from the spirit and scope of the invention as defined in the following claims.

For example, although the aforesaid embodiments have been described assuming that four bits are included in the data code DATA<0:3>, more or less than four bits may be included in the data code DATA<0:3>.

Also, the locations and types of the transistors exemplified in the aforesaid embodiments may vary depending on the polarities of the inputted signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:

a plurality of data driving units, each configured to drive a corresponding data output pad by a power supply voltage supplied through a power supply voltage input pin and a ground voltage supplied through a ground voltage input pin, in response to a corresponding bit of a data code;

a pattern sensing unit configured to sense a bit pattern of the data code and generate a pattern sensing signal; and a phantom driving unit configured to form a current path between the power supply voltage input pin and the ground voltage input pin and to drive the current path by a driving force determined in response to the pattern sensing signal.

2. The semiconductor device of claim 1, wherein the pattern sensing signal includes:

a first pattern sensing signal having a value that increases according to the number of the bits with a value of '0' among the bits of the data code;

a second pattern sensing signal having a value that increases according to the number of the bits with a value of '1' among the bits of the data code; and a third pattern sensing signal having a value that increases according to the number of the bits with a value of '0' among the bits of the data code and decreases according to the number of the bits with a value of '1' among the bits of the data code.

3. The semiconductor device of claim 2, wherein the phantom driving unit drives the current path by the driving force determined in response to the first pattern sensing signal if the data output pads are terminated to a ground voltage terminal.

4. The semiconductor device of claim 2, wherein the phantom driving unit drives the current path by the driving force determined in response to the second pattern sensing signal if the data output pads are terminated to a power supply voltage terminal.

5. The semiconductor device of claim 2, wherein the phantom driving unit drives the current path by the driving force determined in response to the third pattern sensing signal if the data output pads are not terminated to a power supply voltage terminal and a ground voltage terminal.

6. The semiconductor device of claim 2, wherein the phantom driving unit:

drives with an increased driving force as the value of the first to third pattern sensing signal increases; and drives with a decreased driving force as the value of the first to third pattern sensing signal decrease.

7. The semiconductor device of claim 1, wherein the data output pads are terminated to a ground voltage terminal through a plurality of data output pins, respectively.

8. The semiconductor device of claim 7, wherein if a bit of the data code inputted is '0', a corresponding data driving unit controls a pull-up source current not to flow from a power supply terminal to the corresponding data output pad and controls a pull-down sink current to flow from the corresponding data output pad to the ground voltage terminal.

9. The semiconductor device of claim 7, wherein if a bit of the data code inputted is '1', a corresponding data driving unit controls the pull-up source current to flow from the power supply terminal to the corresponding data output pad and controls the pull-down sink current not to flow from the corresponding data output pad to the ground voltage terminal.

10. The semiconductor device of claim 7, wherein the pattern sensing unit comprises:

a binary adding unit configured to increase a binary code value outputted according to the number of the bits with a value of '1' among the bits of the data code;

a binary operating unit configured to calculating a binary code value by subtracting the binary code value outputted from the binary adding unit from the binary code with a value corresponding to the number of the bits of the data code; and a phantom drive control signal generating unit configured to generate the pattern sensing signal having a plurality of phantom drive control signals whose logic levels are determined according to the binary code value outputted from the binary operating unit.

11. The semiconductor device of claim 10, wherein the phantom driving unit comprises:

a plurality of pull-down phantom drivers, each pull-down phantom driver connected between a pull-down phantom node and a reference phantom node, wherein the pull-down phantom node is connected in parallel to the data driving units through the ground voltage input pin and the reference phantom node is connected to the power supply voltage input pin, and wherein the pull-down phantom drivers are selectively enabled in response to a corresponding phantom drive control signal to change the intensity of a phantom sink current flowing from the reference phantom node to the pull-down phantom node.

12. The semiconductor device of claim 11, wherein each of the pull-down phantom drivers comprises:

an NMOS transistor configured to control a flow of the phantom sink current from the drain-connected reference phantom node to the source-connected pull-down phantom node in response to the corresponding phantom drive control signal applied to a gate thereof.

13. The semiconductor device of claim 7, wherein the data driving units comprise:

a plurality of pre-drive units, each configured to generate a drive control signal in response to a corresponding bit of the data code;

a plurality of pull-up main driving units, each configured to control a connection between the power supply voltage input pin and a corresponding data output pad in response to the corresponding drive control signal; and a plurality of pull-down main driving units, each configured to pull-down drive a corresponding data output pad by a pull-down sink current sinking through the ground voltage input pin, in response to the corresponding drive control signal.

14. The semiconductor device of claim 13, wherein the data driving units comprise:

a plurality of pre-drive units, each configured to generate a drive control signal in response to a corresponding bit of the data code;

a plurality of pull-up main driving units, each configured to pull-up drive a corresponding data output pad by a pull-up source current supplied through the power supply voltage input pin, in response to the corresponding drive control signal; and a plurality of pull-down main driving units, each configured to control a connection between the ground voltage input pin and a corresponding data output pad in response to the corresponding drive control signal.

15. The semiconductor device of claim 1, wherein the data output pads are terminated to a power supply voltage terminal through a plurality of data output pins.

16. The semiconductor device of claim 15, wherein if a bit of the data code inputted is '0', a corresponding data driving unit controls a pull-up source current not to flow from a power supply terminal to the corresponding data output pad and controls a pull-down sink current to flow from the corresponding data output pad to the ground voltage terminal.

17. The semiconductor device of claim 15, wherein if a bit of the data code inputted is '1', a corresponding data driving unit controls the pull-up source current to flow from the power supply terminal to the corresponding data output pad and controls the pull-down sink current not to flow from the corresponding data output pad to the ground voltage terminal.

18. The semiconductor device of claim 15, wherein the pattern sensing unit comprises:

a binary adding unit configured to increase a binary code value outputted according to the number of the bits with a value of '0' among the bits of the data code;

a binary operating unit configured to calculating a binary code value by subtracting the binary code value outputted from the binary adding unit from the binary code with a value corresponding to the number of the bits of the data code; and a phantom drive control signal generating unit configured to generate the pattern sensing signal having a plurality of phantom drive control signals whose logic levels are determined according to the binary code value outputted from the binary operating unit.

19. The semiconductor device of claim 18, wherein the phantom driving unit comprises:

a plurality of pull-up phantom drivers, each pull-down phantom driver connected between a pull-up phantom node and a reference phantom node, wherein the pull-down phantom node is connected in parallel to the data driving units through the power supply voltage input pin and the reference phantom node is connected to the ground voltage input pin, and are selectively enabled in response to a corresponding phantom drive control signal to change the intensity of a phantom source current flowing from the pull-up phantom node to the reference phantom node.

20. The semiconductor device of claim 19, wherein each of the pull-up phantom drivers comprises:

a PMOS transistor configured to control a flow of the phantom source current from the source-connected pull-up phantom node to the drain-connected reference phantom node in response to the corresponding phantom drive control signal applied to a gate thereof.

21. The semiconductor device of claim 1, wherein the data output pads are not terminated to a power supply voltage terminal and a ground voltage terminal.

22. The semiconductor device of claim 21, wherein if a bit of the data code inputted is '0', a corresponding data driving unit controls a pull-up source current not to flow from a power supply terminal to the data output pad and controls a pull-down sink current to flow from the corresponding data output pad to the ground voltage terminal.

23. The semiconductor device of claim 22, wherein if a bit of the data code inputted is '1', a corresponding data driving unit controls the pull-up source current to flow from the power supply terminal to the corresponding data output pad and controls the pull-down sink current not to flow from the corresponding data output pad to the ground voltage terminal.

24. The semiconductor device of claim 21, wherein the pattern sensing unit comprises:

a first binary adding unit configured to increase a binary code value outputted according to the number of the bits with a value of '0' among the bits of the data code;

a second binary adding unit configured to increase a binary code value outputted according to the number of the bits with a value of '1' among the bits of the data code; and a phantom drive control signal generating unit configured to compare the binary code value outputted from the first binary adding unit with the binary code value outputted from the second binary adding unit and generate the pattern sensing signal having a plurality of phantom drive control signals whose logic levels are determined according to the comparison results.

25. The semiconductor device of claim 24, wherein the phantom driving unit comprises:

a pull-up phantom driving unit configured to pull-up drive a first reference phantom node connected to the ground voltage input pin, by a phantom source current that is supplied through a pull-up phantom node connected in parallel to the data driving units through the power supply voltage input pin and changes in intensity according to the phantom drive control signals; and a pull-down phantom driving unit configured to pull-down drive a second reference phantom node connected to the power supply voltage input pin, by a phantom sink current that sinks through a pull-down phantom node connected in parallel to the data driving units through the ground voltage input pin and changes in intensity according to the phantom drive control signals.

26. The semiconductor device of claim 25, wherein the pull-up phantom driving unit comprises:

a plurality of pull-up phantom drivers that are connected between the pull-up phantom node and the first reference phantom node and are selectively enabled in response to the corresponding phantom drive control signals to change the intensity of the phantom source current flowing from the pull-up phantom node to the first reference phantom node.

27. The semiconductor device of claim 26, wherein each of the pull-up phantom drivers comprises:

a PMOS transistor configured to control the flow of the phantom source current from the source-connected pull-up phantom node to the drain-connected first reference phantom node in response to the phantom drive control signal applied to a gate thereof.

28. The semiconductor device of claim 25, wherein the pull-down phantom driving unit comprises:

a plurality of pull-down phantom drivers that are connected between the pull-down phantom node and the second reference phantom node and are selectively enabled in response to the corresponding phantom drive control signals to change the intensity of the phantom sink current flowing from the second reference phantom node to the pull-down phantom node.

29. The semiconductor device of claim 28, wherein each of the pull-down phantom drivers comprises:

an NMOS transistor configured to control the flow of the phantom sink current from the drain-connected second reference phantom node to the source-connected pull-down phantom node in response to the phantom drive control signal applied to a gate thereof.

30. The semiconductor device of claim 21, wherein the data driving units comprise:

a plurality of pre-drive units configured to generate a plurality of drive control signals in response to the corresponding bits of the data code;

a plurality of pull-up main driving units configured to pull-up drive the data output pads by a pull-up source current supplied through the power supply voltage input pin, in response to the corresponding drive control signals; and a plurality of pull-down main driving units configured to pull-down drive the data output pads by a pull-down sink current sinking through the ground voltage input pin, in response to the corresponding drive control signals.

31. A semiconductor device comprising:

a plurality of data driving units, each configured to drive a corresponding data output pad by a data current provided through a power supply voltage input pin and a ground voltage input pin, in response to a corresponding bits of a data code;

a pattern sensing unit configured to sense a bit pattern of the data code and generate a pattern sensing signal; and a phantom current generating unit configured to generate a phantom current that flows from the power supply voltage input pin to the ground voltage input pin and changes in intensity in response to the pattern sensing signal.

32. The semiconductor device of claim 31, wherein the pattern sensing signal includes:

a first pattern sensing signal having a value that increases according to the number of the bits with a value of '1' among the bits of the data code;

a second pattern sensing signal having a value that increases according to the number of the bits with a value of '1' among the bits of the data code; and a third pattern sensing signal having a value that increases according to the number of the bits with a value of '0' among the bits of the data code and decreases according to the number of the bits with a value of '1' among the bits of the data code.

33. The semiconductor device of claim 32, wherein if the data output pads are terminated to a ground voltage terminal, the phantom current generating unit generates the phantom current that has a value determined according to the first pattern sensing signal and flows from the power supply voltage input pin to the ground voltage input pin.

34. The semiconductor device of claim 32, wherein if the data output pads are terminated to a power supply voltage terminal, the phantom current generating unit generates the phantom current that has a value determined according to the second pattern sensing signal and flows from the power supply voltage input pin to the ground voltage input pin.

35. The semiconductor device of claim 32, wherein if the data output pads are not terminated to a power supply voltage terminal and a ground voltage terminal, the phantom current generating unit generates the phantom current that has a value determined according to the third pattern sensing signal and flows from the power supply voltage input pin to the ground voltage input pin.

36. The semiconductor device of claim 32, wherein the intensity of the phantom current flowing from the power supply voltage input pin to the ground voltage input pin increases with an increase in the value of the first to third pattern sensing signals and decreases with a decrease in the value of the first to third pattern sensing signals.

37. A method for operating a semiconductor device, comprising:

driving a plurality of data output pads by a first power supply voltage and a second power supply voltage according to the corresponding bits of a data code; and controlling a current flowing between a first power supply voltage terminal and a second power supply voltage terminal according to a bit pattern of the data code, wherein controlling the current comprises:

sensing the bit pattern of the data code; and changing the intensity of the current flowing between the first power supply voltage terminal and the second power supply voltage terminal according to the sensing results.

38. The method of claim 37, wherein generating the pattern sensing signal comprises:

generating a first pattern sensing signal having a value that increases according to the number of the bits with a value of '0' among the bits of the data code;

generating a second pattern sensing signal having a value that increases according to the number of the bits with a value of '1' among the bits of the data code; and generating a third pattern sensing signal having a value that increases according to the number of the bits with a value of '0' among the bits of the data code and decreases according to the number of the bits with a value of '1' among the bits of the data code.

39. The method of claim 38, wherein changing the intensity of the current comprises:

changing the intensity of the current flowing from the first power supply voltage terminal to the second power supply voltage terminal, in response to the first pattern sensing signal, if the data output pads are terminated to the second power supply voltage terminal;

changing the intensity of the current flowing from the first power supply voltage terminal to the second power supply voltage terminal, in response to the second pattern sensing signal, if the data output pads are terminated to the first power supply voltage terminal; and changing the intensity of the current flowing from the first power supply voltage terminal to the second power supply voltage terminal, in response to the third pattern sensing signal, if the data output pads are not terminated to the first power supply voltage terminal and the second power supply voltage terminal.

40. The method of claim 39, wherein changing the intensity of the current comprises:

increasing the intensity of the current flowing from the first power supply voltage terminal to the second power supply voltage terminal as the value of the first to third pattern sensing signals increases; and decreasing the intensity of the current flowing from the first power supply voltage terminal to the second power supply voltage terminal as the value of the first to third pattern sensing signals decreases.

* * * * *